(12) United States Patent
Saito et al.

(10) Patent No.: US 7,001,460 B2
(45) Date of Patent: Feb. 21, 2006

(54) SEMICONDUCTOR ELEMENT AND ITS MANUFACTURING METHOD

(75) Inventors: Keishi Saito, Nara-ken (JP); Masafumi Sano, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/625,672

(22) Filed: Jul. 24, 2003

(65) Prior Publication Data

US 2005/0173704 A1 Aug. 11, 2005

Related U.S. Application Data

(62) Division of application No. 09/839,891, filed on Apr. 23, 2001, now Pat. No. 6,635,899, which is a division of application No. 09/266,829, filed on Mar. 12, 1999, now Pat. No. 6,303,945.

(30) Foreign Application Priority Data

Mar. 16, 1998 (JP) ................................. 10-065287
Mar. 17, 1998 (JP) ................................. 10-066854

(51) Int. Cl.
*C30B 25/14* (2006.01)

(52) U.S. Cl. .............................. 117/86; 117/87; 117/90; 117/93; 117/94; 117/95; 117/104; 117/935

(58) Field of Classification Search .................. 117/86, 117/87, 90, 93, 94, 95, 104, 935
See application file for complete search history.

(56) References Cited

U.S. PATENT DOCUMENTS

| | | | |
|---|---|---|---|
| 4,600,801 A | 7/1986 | Guha et al. .................. 136/249 |
| 4,609,771 A | 9/1986 | Guha et al. .................. 136/249 |
| 4,775,425 A | 10/1988 | Guha et al. .................. 136/249 |
| 5,486,237 A * | 1/1996 | Sano et al. .................. 136/258 |
| 5,720,827 A | 2/1998 | Simmons .................... 136/250 |
| 5,851,904 A | 12/1998 | Schwarz et al. ............ 438/482 |
| 5,913,986 A | 6/1999 | Matsuyama ................. 136/255 |
| 6,013,544 A | 1/2000 | Makita et al. .............. 438/166 |
| 6,020,224 A | 2/2000 | Shimogaichi et al. ........ 438/158 |
| 6,027,987 A | 2/2000 | Yamazaki et al. ........... 438/486 |
| 6,033,940 A | 3/2000 | Jinda .......................... 438/151 |
| 6,180,870 B1 | 1/2001 | Sano et al. .................. 136/258 |
| 6,548,380 B1 * | 4/2003 | Goto et al. .................. 438/485 |

FOREIGN PATENT DOCUMENTS

| | | |
|---|---|---|
| CN | 1175095 A | 3/1998 |
| DE | 43 33 416 | 4/1995 |
| EP | 0 675 551 | 10/1995 |

OTHER PUBLICATIONS

J. Meier, et al., "Towards High Efficiency Thin Film Silicon Solar Cells With The 'Micromorph' Concept", Solar Energy Materials and Solar Cells, vol. 49, pp. 35-44 (1997).

(Continued)

*Primary Examiner*—Robert Kunemund
(74) *Attorney, Agent, or Firm*—Fitzpatrick, Cella, Harper & Scinto

(57) ABSTRACT

In a semiconductor element comprising microcrystalline semiconductor, a semiconductor junction is provided within a microcrystal grain. Further, in a semiconductor element comprising microcrystalline semiconductor, microcrystal grains of different grain diameters are provided as a mixture to form a semiconductor layer. Thereby, discontinuity of a semiconductor junction is lessened to thereby improve the characteristics, durability, and heat resisting properties of a semiconductor element. Distortion in a semiconductor layer is also reduced.

5 Claims, 5 Drawing Sheets

OTHER PUBLICATIONS

J. Yi, et al., "Amorphous and Micro-Crystalline Silicon for Photovoltaic Application", Proc. of the Photovoltaic Spec. Conf., vol. 23, pp. 977-980 (1993).

J. Meier, et al., "On The Way Towards High Efficiency Thin Film Silicon Solar Cells By The Micromorph Concept", Mat. Res. Soc. Symp. Proc., vol. 420, pp. 3-14 (1996).

A. Matsuda, "Structural Study on Amorphous-Microcrystalline Mixed-Phase Si:H Films", Jap. J. Appl. Phys., vol. 20, No. 6, pp. L439-L442 (1981).

A. Matsuda, et al. "Boron Doping of Hydrogenated Silicon Thin Films", Jap. J. Appl. Phys., vol. 20, No. 3, pp. L183-L186 (1981).

A. Matsuda, et al., "Electrical and Structural Properties of Phosphorous-Doped Glow-Discharge Si: F: H and Si:H Films", Jap. J. Appl. Phys., vol. 19, No. 6, pp. L305-L308 (1980).

S. Usui, et al., "Properties of Heavily Doped GD-Si With Low Resistivity", Journal of Non-Crystalline Solids, vol. 34, No. 1, pp. 1-11 (1979).

* cited by examiner

FIG. 5
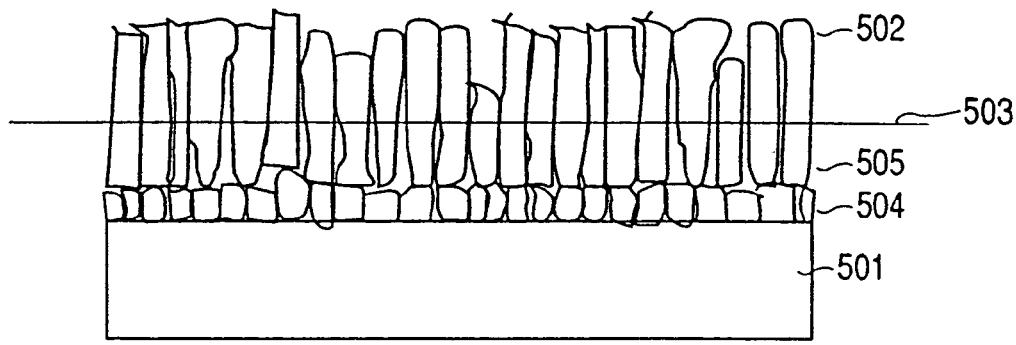
FIG. 6A
FIG. 6B
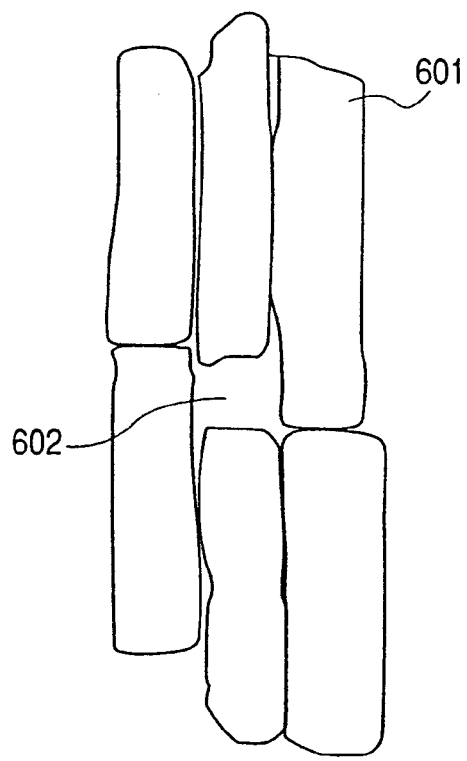
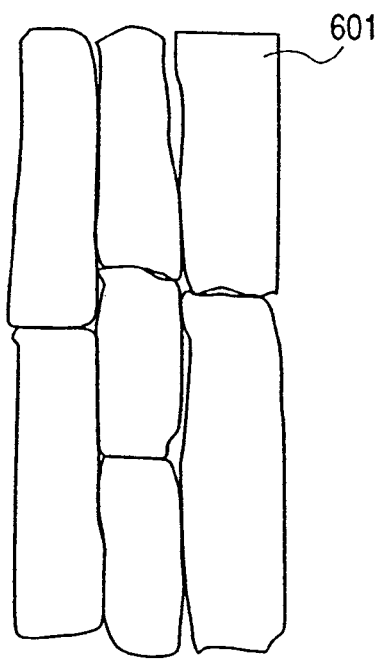

SEMICONDUCTOR ELEMENT AND ITS MANUFACTURING METHOD

This application is a division of application Ser. No. 09/839,891, filed Apr. 23, 2001 now U.S. Pat. No. 6,635,899, allowed, which is a division of application Ser. No. 09/266,829, filed Mar. 12, 1999, now U.S. Pat. No. 6,303,945.

BACKGROUND OF THE INVENTION

1. Field of the Invention

The present invention relates to a semiconductor element and its manufacturing method, particularly to a functional semiconductor element such as a photovoltaic element and a thin film transistor and its manufacturing method.

2. Related Background Art

Microcrystalline silicon semiconductors have been presented since 1979, See, e.g., S. USUI and M. KIKUCHI, "PROPERTIES OF HEAVILY DOPED GD-Si WITH LOW RESISTIVITY", Journal of Non-Crystalline Solids, 34 (1979), pp. 1 to 11. This article described that a low-resistivity microcrystalline silicon semiconductor doped with phosphorus was able to be deposited by a glow discharge method.

The same fact is described in A. MATSUDA, S. YAMASAKI et al., "Electrical and Structural Properties of Phosphorous-Doped Glow-Discharge Si:F:H and Si:H Films", Japanese Journal of Applied Physics, Vol. 19, No. 6, June, 1980, pp. L305 to L308.

Further, A. Matsuda, M. Matsumura et al., "Boron Doping of Hydrogenated Silicon Thin Films", Japanese Journal of Applied Physics, Vol. 20, No. 3, March, 1981, pp. L183 to L186 discusses the characteristics of a mixed-phase of boron-doped amorphous and microcrystalline silicon.

A. MATSUDA, T. YOSHIDA et al., "Structural Study on Amorphous-Microcrystalline Mixed-Phase Si:H Films", Japanese Journal of Applied Physics, Vol. 20, No. 6, June, 1981, pp. L439 to L442 discusses the structure of an amorphous and microcrystalline mixed-phase.

However, the possibility that such mixed layers of amorphous and microcrystalline silicon could be applied to semiconductor elements such as solar cells has been suggested, but there has been no actual application.

Solar cells using microcrystalline silicon semiconductors have been described in U.S. Pat. No. 4,600,801 "FLUORINATED P-DOPED MICROCRYSTALLINE SILICON SEMICONDUCTOR ALLOY MATERIAL", U.S. Pat. No. 4,609,771 "TANDEM JUNCTION SOLAR CELL DEVICES INCORPORATING IMPROVED MICROCRYSTALLINE P-DOPED SEMICONDUCTOR ALLOY MATERIAL", and U.S. Pat. No. 4,775,425 "P- AND N-TYPE MICROCRYSTALLINE SEMICONDUCTOR ALLOY MATERIAL INCLUDING BAND GAP WIDENING ELEMENTS, DEVICES UTILIZING SAME". However, the microcrystalline silicon semiconductors described in these patents have been used in p-type or n-type semiconductor layers in solar cells of a pin structure using an amorphous i-type semiconductor layer.

Recently, articles on solar cells using microcrystalline silicon in an i-type semiconductor layer have been published. For example, there is "ON THE WAY TOWARDS HIGH EFFICIENCY THIN FILM SILICON SOLAR CELLS BY THE MICROMORPH CONCEPT", J. Meier, P. Torres et al., Mat. Res. Soc. Symp. Proc., Vol. 420, (1996) p. 3. However, as acknowledged by the authors of the article, the initial photoelectric conversion efficiency in a single structure solar cell using microcrystalline silicon in an i-type semiconductor layer is 7.7%, which is lower than that for solar cells with the same structure using amorphous silicon.

The present inventors have diligently inspected the reason why the conversion efficiency of solar cells using microcrystalline silicon semiconductors in an i-type semiconductor layer is lower than that of amorphous silicon solar cells with the same structure. The results make clear that the main cause lies in the interfaces between the n-type semiconductor layer or the p-type semiconductor layer with the i-type semiconductor layer. Specifically, the present inventors have discovered that there are many defect states in the vicinity of the interface of the n-type semiconductor layer with the i-type semiconductor layer as well as in the vicinity of the interface of the p-type semiconductor layer with the i-type semiconductor layer, which function as recombination centers. The existence of the recombination centers results in reduction in number and lowering in transportability of photo-excited free carriers in the i-type semiconductor layer. As a result, the open circuit voltage (Voc), short-circuit current (Jsc), and fill factor (FF) of the solar cell decline. Further, it is attributable to an increase in series resistance and a decline in the shunt resistance of the solar cell. As a result, the conversion efficiency of the solar cell declines.

When the inventors teamed up a transmission electron microscope with a secondary ion mass spectrometer and searched for the cause of the many defect states in the vicinity of the interfaces mentioned above, they discovered that the n-type semiconductor layer and the i-type semiconductor layer, or the p-type semiconductor layer and the i-type semiconductor layer were discontinuously stacked. Thus, they assumed that the reason why there were many defect states in the vicinity of the interfaces mentioned above was that the n-type semiconductor layer and the i-type semiconductor layer, or the p-type semiconductor layer and the i-type semiconductor layer were discontinuously stacked.

Further, when usual semiconductor elements are left to stand in the atmospheric environment, molecules in the air (water, oxygen, nitrogen, nitrogen oxides, sulfurous compounds, etc.) or the elements contained therein may sometimes diffuse into the semiconductor element to lower the characteristics of the semiconductor element. Similarly, when a semiconductor element such as a solar cell is encapsulated with another material (encapsulant), a chemical substance (acetic acid, etc.) contained in the encapsulant may sometimes diffuse into the semiconductor element to lower the characteristics of the semiconductor element. In particular, when each layer is stacked discontinuously at the semiconductor junction (junction of n-type semiconductor layer with i-type semiconductor layer, junction of p-type semiconductor layer with i-type semiconductor layer, etc.), the diffused substance will be trapped by the interface defects to lower the semiconductor characteristics.

When the inventors analyzed transmission electron microscope and X-ray diffraction data, it became clear that structural distortions were liable to be concentrated in the relatively large spaces between microcrystal grains, where there were many defects. These defects will reduce the transportability (mobility) of photo-excited free carriers and shorten the lifetime thereof to lower the characteristics of the semiconductor element.

The present invention aims to solve the above-mentioned problems and improve the photoelectric conversion efficiency of a photoelectric conversion element represented by a solar cell.

The present invention also aims to eradicate the discontinuity in the semiconductor junction portion to thereby provide a semiconductor element with superior semiconductor characteristics.

The present invention further aims to reduce the defects between microcrystal grains and to dissolve the discontinuity at the semiconductor junction portion to thereby provide a semiconductor element with superior semiconductor characteristics.

In addition, the present invention aims to improve the heat resisting properties and durability of a semiconductor element.

SUMMARY OF THE INVENTION

A first aspect of the present invention is directed to a semiconductor element comprising microcrystalline semiconductor, having a semiconductor junction in a microcrystal grain.

A second aspect of the present invention is directed to a semiconductor element comprising a semiconductor layer having first electric characteristics, a semiconductor layer having second electric characteristics, and a semiconductor layer having third electric characteristics stacked in the named order, wherein a microcrystal grain is present extending over at least a portion of the semiconductor layer having the first electric characteristics and at least a portion of the semiconductor layer having the second electric characteristics.

A third aspect of the present invention is directed to a method of manufacturing a semiconductor element comprising the steps of:

forming a semiconductor layer having first electric characteristics on a substrate;

crystallizing the semiconductor layer having the first electric characteristics; and growing a crystalline semiconductor layer having second electric characteristics on the crystallized semiconductor layer having the first electric characteristics, thereby growing a microcrystal grain so as to extend over the semiconductor layer having the first electric characteristics and the semiconductor layer having the second electric characteristics.

A fourth aspect of the present invention is directed to a method of manufacturing a semiconductor element comprising the steps of:

forming a crystalline semiconductor layer having first electric characteristics on a substrate; and growing a crystalline semiconductor layer having second electric characteristics on the semiconductor layer having the first electric characteristics, thereby growing a microcrystal grain so as to extend over the semiconductor layer having the first electric characteristics and the semiconductor layer having the second electric characteristics.

A fifth aspect of the present invention is directed to a method of manufacturing a semiconductor element comprising the steps of:

forming a semiconductor layer having first electric characteristics on a substrate;

growing a semiconductor layer having second electric characteristics on the semiconductor layer having the first electric characteristics; and effecting annealing to form a microcrystal grain so as to extend over the semiconductor layer having the first electric characteristics and the semiconductor layer having the second electric characteristics.

A sixth aspect of the present invention is directed to a method of manufacturing a semiconductor element comprising the steps of:

forming a crystalline semiconductor layer on a substrate; and ion-implanting a dopant into the semiconductor layer to form a semiconductor junction in a microcrystal grain of the semiconductor layer.

A seventh aspect of the present invention is directed to a semiconductor element comprising microcrystalline semiconductor, having a region where microcrystal grains with different grain diameters are present as a mixture.

An eighth aspect of the present invention is directed to a semiconductor element comprising a semiconductor layer having first electric characteristics, a semiconductor layer having second electric characteristics and a semiconductor layer having third electric characteristics stacked in the named order, wherein microcrystal grains with different grain diameters are present as a mixture in at least one of the semiconductor layers.

A ninth aspect of the present invention is directed to a method of manufacturing a semiconductor element comprising the step of generating a plasma in a gas phase to decompose a source gas, thus forming a semiconductor layer comprising microcrystals on a substrate, wherein an electric power to be applied to the plasma is periodically changed to form a semiconductor layer comprising microcrystal grains of different sizes as a mixture.

A tenth aspect of the present invention is directed to a method of manufacturing a semiconductor element comprising the step of generating a plasma in a gas phase to decompose a source gas, thus forming a semiconductor layer comprising microcrystals on a substrate, wherein a halogen-containing gas is added at regular intervals into the source gas to form a semiconductor layer comprising microcrystal grains of different sizes as a mixture.

BRIEF DESCRIPTION OF THE DRAWINGS

FIG. 5 is a schematic sectional view showing an example in which a microcrystalline semiconductor layer is deposited on a reflection increasing layer, and another microcrystalline semiconductor layer is grown thereon; and FIG. 6A is a schematic partial sectional view showing a microcrystalline semiconductor layer in which the grain diameters of microcrystal grains are uniform, and FIG. 6B is a schematic partial sectional view showing a microcrystalline semiconductor layer in which the grain diameters of microcrystal grains are different.

DETAILED DESCRIPTION OF THE PREFERRED EMBODIMENTS

Figure 1:
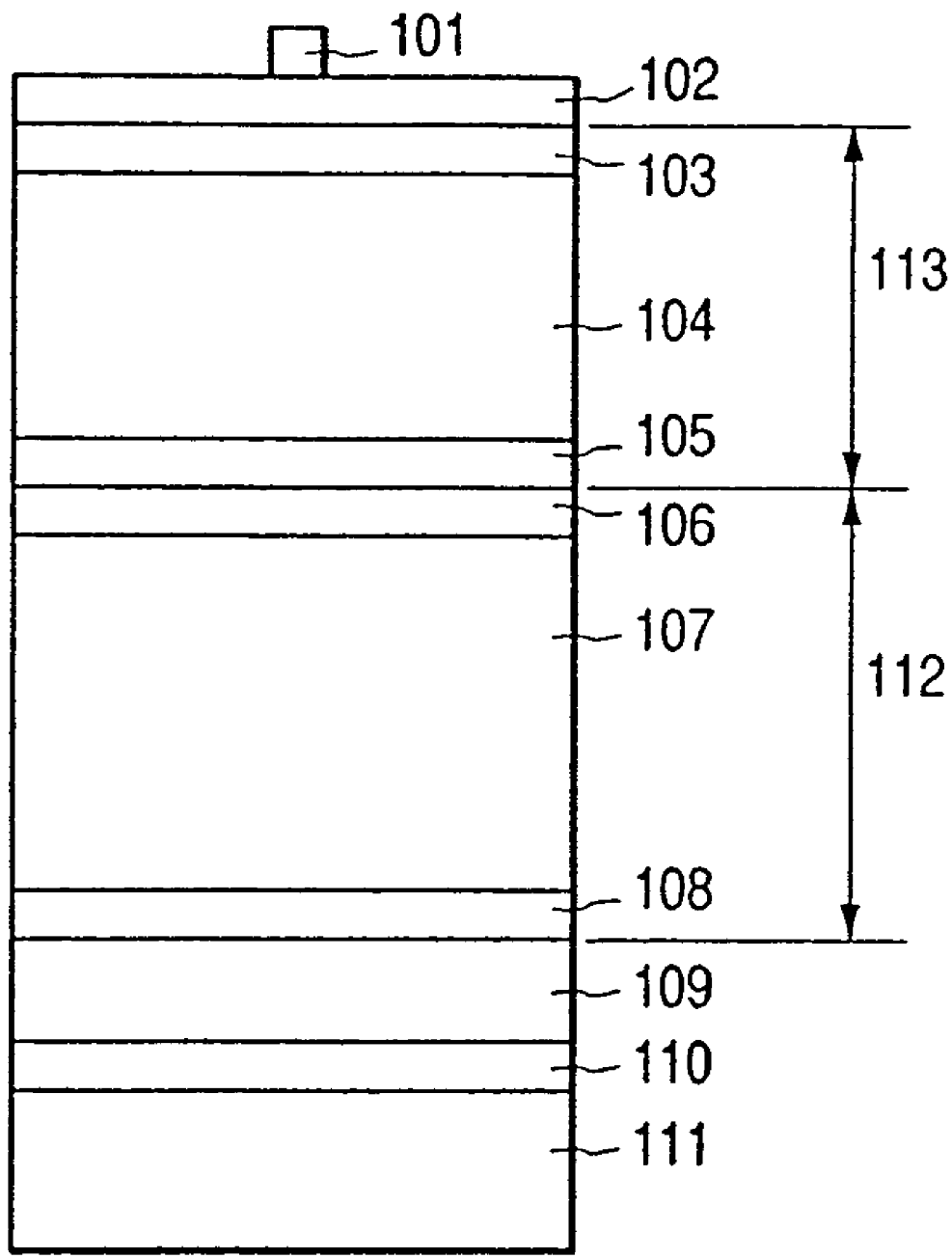
FIG. 1 is a schematic sectional view showing an example of the layer structure of a photovoltaic element, which is an example of the semiconductor element of the present invention.

The present inventors have performed a rigorous investigation in order to solve the above mentioned problems. As a result, it has been found that in a semiconductor element comprising microcrystalline semiconductor, an effective way to solve such problems is providing a semiconductor junction within a microcrystal grain. In the semiconductor element, at least a portion of each of two semiconductor layers with different electric characteristics (for example a portion of the n-type semiconductor layer and a portion of the i-type semiconductor layer or a portion of the p-type semiconductor layer and a portion of the i-type semiconductor layer) are formed in the vicinity of the interface between the layers within the same microcrystal grain. In other words, in the semiconductor element, there are microcrystal grains that extend over two semiconductor layers. In this way, by forming a semiconductor junction such as p/i or n/i within microcrystal grains, defect states in the vicinity of the interface can be reduced to a great extent. As a result, declines in the open circuit voltage (Voc), short circuit current (Jsc), and fill factor (FF) of a solar cell are prevented. Further, increase in the series resistance and decrease in the shunt resistance of a solar cell can be prevented. As a result, the conversion efficiency of the solar cell can be improved.

Further, the heat resisting properties of the semiconductor element can be improved by forming a semiconductor junction within microcrystal grains.

In addition, discontinuity in layer interfaces in the semiconductor junction portion can be eliminated and the characteristics of the semiconductor element are improved by forming a semiconductor junction within the microcrystal grains. For example, by forming a semiconductor junction within the microcrystal grains, a depletion layer of a semiconductor junction expands further than in conventional semiconductor elements having a semiconductor junction. As a result, the rectifying characteristics are better than in a conventional semiconductor junction, and the dark current when applied with a reverse bias can also be kept low.

The present inventors have discovered that in a semiconductor element comprising microcrystalline semiconductors, providing microcrystal grains with different grain diameters as a mixture within the semiconductor layer and providing a semiconductor junction within the microcrystal grains are effective ways to solve the above-mentioned problems. In the specification and claims, the expression "a semiconductor layer comprising microcrystal grains of different grain diameters as a mixture" means a semiconductor layer in which microcrystal grains having different grain diameters without any regularity are distributed almost at random. Further, the fact that microcrystal grains with different grain diameters are present as a mixture has been confirmed by calculating the average crystalline grain diameter from the half-width of the X-ray diffraction (220) peak and finding the average crystalline grain diameter from the dark-field image of a transmission electron microscope, and finding that they differ by more than 50 Å. In the semiconductor element, by mixing microcrystal grains with different crystal grain diameters, distortions can be made even smaller than when a three dimensional space (semiconductor layer) is filled with microcrystal grains of the same crystalline grain diameters. As a result, it is possible to increase the transportability (mobility) of photo-excited free carriers in the microcrystalline semiconductor layer and to lengthen the lifetime of the carriers. Further, in the semiconductor element, at least a portion of each of two semiconductor layers with different electric characteristics (for example, a portion of the n-type semiconductor layer and a portion of the i-type semiconductor layer or a portion of the p-type semiconductor layer and a portion of the i-type semiconductor layer) are formed within the same microcrystal grains in the vicinity of the interface of the two layers. In other words, in the semiconductor element, microcrystal grains are present extending over two semiconductor layers. Forming a semiconductor junction such as p/i or n/i within microcrystal grains in such a way can reduce the defect states in the vicinity of the interface to a great extent. As a result, declines in the open circuit voltage (Voc), short circuit current (Jsc), and fill factor (FF) of the solar cell are prevented. Further, increase in the series resistance and decline in the shunt resistance of the solar cell are also prevented. As a result, the conversion efficiency of the solar cell is improved.

Also in this case, the heat resisting properties of the semiconductor element are also improved by forming a semiconductor junction within the microcrystal grains.

Further, also in this case, discontinuity in the layer interface at the semiconductor junction is eliminated and the semiconductor element characteristics are improved by forming a semiconductor junction within microcrystal grains.

A photovoltaic element is taken as an example of the semiconductor element of the present invention and is explained referring to the drawings hereinafter.

FIG. 1 shows an example of the layer structure of a photovoltaic element, which is an example of the semiconductor element of the present invention. This photovoltaic element is composed of a substrate 111 (an electroconductive substrate comprised of a metal such as stainless steel or an insulating substrate comprised of glass or the like), with a reflection layer 110 comprised of a metal such as Al, Cu, or Ag, a reflection increasing layer 109 comprised of a metallic oxide or the like such as zinc oxide, indium oxide, or tin oxide, a bottom photovoltaic element 112 comprising an n-type or p-type semiconductor layer (the layer having the first electric characteristics) 108, an i-type semiconductor layer (the layer having the second electric characteristics) 107, and a p-type or n-type semiconductor layer (the layer having the third electric characteristics) 106 and a top photovoltaic element 113 comprising an n-type or p-type semiconductor layer 105, an i-type semiconductor layer 104, and a p-type or n-type semiconductor layer 103, and then a transparent electrode 102 such as of ITO and a grid (collector electrode) 101 on top. In this photovoltaic element the bottom photovoltaic element i-type semiconductor layer is constituted of microcrystalline silicon semiconductor.

Figure 3:
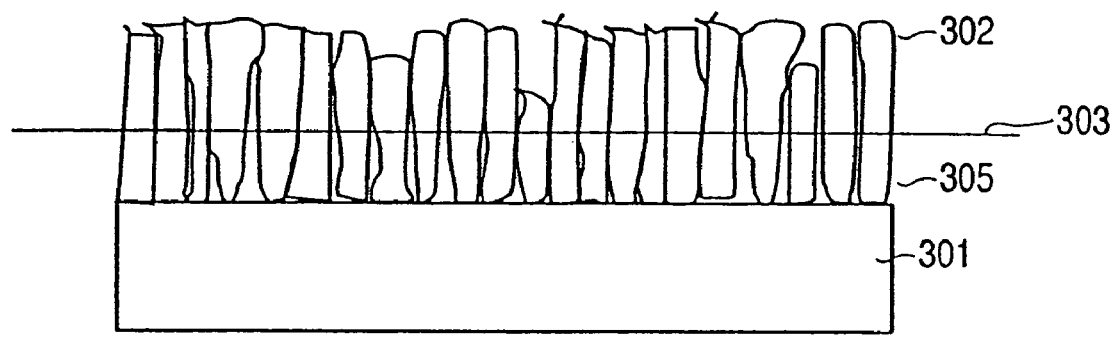
FIG. 3 is a schematic sectional view showing an example in which a microcrystalline semiconductor layer is grown almost just above a reflection increasing layer.
Figure 4:
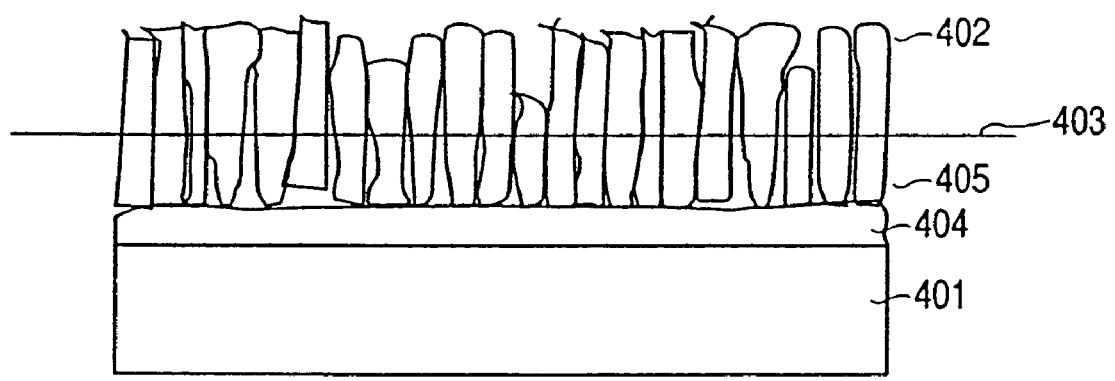
FIG. 4 is a schematic sectional view showing an example in which an amorphous layer is deposited on a reflection increasing layer, and a microcrystalline semiconductor layer is grown thereon.

FIGS. 3 through 5 show enlargements of the reflection increasing layer 109, the layer 108 having the first electric characteristics and the layer 107 having the second electric characteristics of FIG. 1.

FIG. 3 is an example in which microcrystalline semiconductor layers 302 and 305 are grown almost Just on a reflection increasing layer 301. The semiconductor layer having the first electric characteristics is the portion 305 below the straight line 303. The semiconductor layer having the second electric characteristics is the portion 302 above the straight line 303. FIG. 4 is an example in which an amorphous semiconductor layer is deposited on the reflection increasing layer 401 in several 100 Å for example, and microcrystalline semiconductor layers 402 and 405 are grown thereon. The semiconductor layer having the first electric characteristics is the portion 405 below the straight line 403. The semiconductor layer having the second electric characteristics is the portion 402 above the straight line 403.

FIG. 5 is an example in which a microcrystalline semiconductor layer 504 is deposited on the reflection increasing layer 501 in several 100 Å for example, and microcrystalline semiconductor layers 502 and 505 are grown thereon. The semiconductor layer having the first electric characteristics 505 is the portion below the straight line 503. The semiconductor layer having the second electric characteristics 502 is the portion above the straight line 503. In either example, a semiconductor junction is present within the microcrystal grains. The shape of the microcrystals having a semiconductor junction within the microcrystal grains is preferably a columnar shape when observed with a transmission electron microscope. One example of the preferred embodiments of the content of an additive for changing the electric characteristics of microcrystals having a semiconductor junction within microcrystal grains is such that the content is varied in the direction of thickness of the semiconductor layer having the first electric characteristics.

Figure 7:
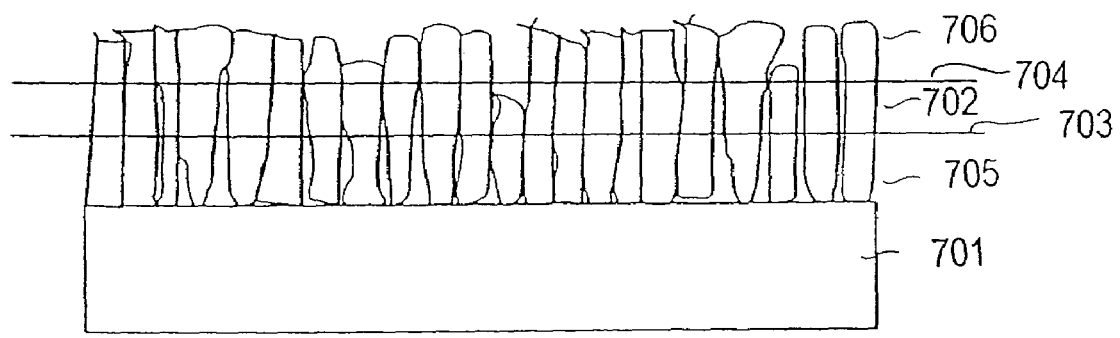
FIG. 7 is a schematic sectional view showing an example in which a microcrystalline semiconductor layer is deposited on a substrate.

FIG. 7 is an example in which microcrystalline semiconductor layers 705, 702 and 706 are grown on a substrate 701. The semiconductor layer having the first electric characteristics is the portion 705 below the straight line 703. The semiconductor layer having the second electric characteristics is the portion 702 above the straight line 703 and below the straight line 704. The semiconductor layer having the third electric characteristics is the portion 706 above the straight line 704.

FIG. 6A is a schematic partial sectional view showing a microcrystalline semiconductor layer in which the grain diameters of microcrystal grains are uniform, and FIG. 6B is a schematic partial sectional view showing a microcrystalline semiconductor layer in which the grain diameters of microcrystal grains are different. In the microcrystalline semiconductor layer of FIG. 6A, since the grain diameters of the microcrystal grains 601 are uniform, an amorphous layer with many defects unfilled by microcrystal grains is present in the microcrystalline semiconductor layer. In FIG. 6A reference numeral 602 designates a space not filled with microcrystals. On the other hand, since the microcrystalline semiconductor layer of FIG. 6B is constituted of microcrystal grains with different grain diameters, there is substantially no space unfilled with microcrystal grains. As a result, the mobility and lifetime of carriers of the microcrystalline semiconductor layer of FIG. 6B will be greater than those of FIG. 6A.

Figure 2:
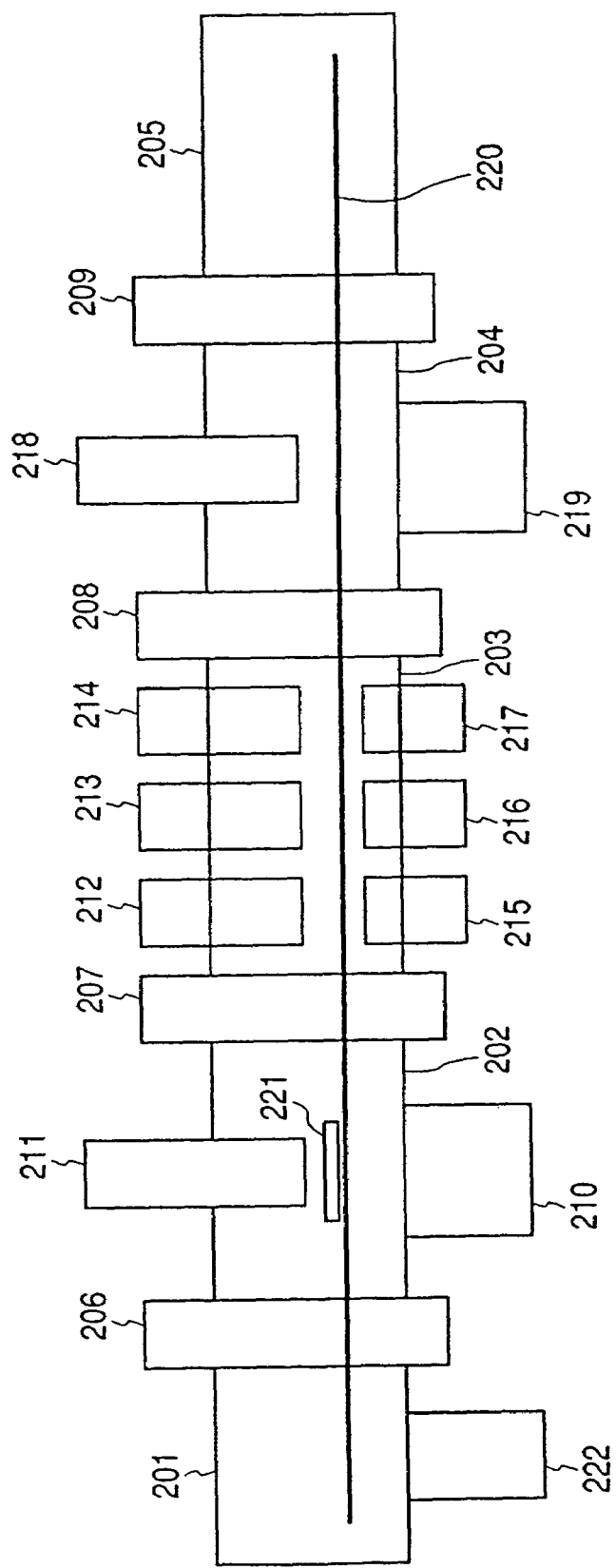
FIG. 2 is a schematic view showing an example of a deposited film forming apparatus for producing a photovoltaic element, which is an example of the semiconductor element of the present invention.

FIG. 2 is an example of a deposited film forming apparatus for producing a photovoltaic element, which is an example of the semiconductor element of the present invention. This deposited film forming apparatus is constructed of a load chamber 201, a microcrystalline silicon i-type semiconductor layer deposition chamber 202, a silicon semiconductor layer (i-type semiconductor layer, p-type semiconductor layer, n-type semiconductor layer) deposition RF chamber 203, a microcrystalline silicon germanium i-type semiconductor layer deposition chamber 204, and an unloading chamber 205. The loading chamber is equipped with a laser-annealing heater not shown in the drawing, and a window 222 for irradiating the semiconductor layer with a laser which is not shown in the drawing.

Gate valves 206, 207, 208, and 209 separate each chamber so that the source gases do not mix. The microcrystalline silicon i-type semiconductor layer deposition chamber 202 is constructed of a heater 211 for substrate heating and a plasma CVD chamber 210. The RF chamber 203 is equipped with a heater 212 for n-type semiconductor layer deposition and a deposition chamber 215 for depositing the n-type semiconductor layer, a heater 213 for depositing the i-type semiconductor layer and a deposition chamber 216 for depositing the i-type semiconductor layer, and a heater 214 for depositing the p-type semiconductor layer and a deposition chamber 217 for depositing the p-type semiconductor layer. The microcrystalline silicon germanium i-type semiconductor layer deposition chamber 204 has a heater 218 and a plasma CVD chamber 219. A substrate is attached to a substrate holder 221, which is moved by a roller driven from the outside above a rail 220. For depositing the microcrystalline semiconductor, microwave plasma CVD method or VHF plasma CVD method are preferably used, but RF plasma CVD method can also be used.

A photovoltaic element which is an example of the semiconductor element of the present invention, is formed as described below.

First, an SUS substrate 111 having a reflective layer 110 and a reflection increasing layer 109 formed thereon is set on the substrate holder 221, and then set on the rail 220 inside the loading chamber 201. The loading chamber 201 is exhausted to a vacuum degree under of several mTorr (1 Torr=133 Pa) or less. The gate valves 206 and 207 are opened, and the substrate holder is transferred to the n-type semiconductor layer deposition chamber 215 of the chamber 203. Each gate valve is closed and the n-type semiconductor layer 108 is deposited with desired source gases in a desired layer thickness. After exhausting sufficiently, the substrate holder is transferred to the loading chamber 201. The substrate is heated with a heater not shown in the drawing until the substrate temperature reaches 400° C., and after the substrate temperature has become constant, the n-type semiconductor layer 108 is crystallized with an XeCl laser not shown in the drawing. The internal pressure of the loading chamber during the laser irradiation is maintained at a degree of vacuum not higher than $10^{-3}$ Torr. The substrate holder is transferred to the microcrystalline silicon i-type semiconductor layer deposition chamber 202 and the gate valves 206 and 207 are closed. The substrate is heated with the heater 211 to a desired substrate temperature; a necessary amount of desired source gases are introduced; a desired degree of vacuum is attained; predetermined microwave energy or VHF energy is introduced into the deposition chamber 210; and a plasma is generated to deposit the microcrystalline silicon i-type semiconductor layer 107 in a desired layer thickness on the n-type semiconductor layer 108. At this time, in order that the i-type semiconductor layer 107 is epitaxially grown on the n-type semiconductor layer 108, it is preferred that the i-type semiconductor layer 107 is deposited continuously after hydrogen plasma treatment of the n-type semiconductor layer 108 or that the substrate temperature during deposition of the i-type semiconductor layer 107 is made higher than the substrate temperature during deposition of the n-type semiconductor layer 108.

Next, the chamber 202 is exhausted sufficiently; the gate valve 207 is opened; and the substrate holder 221 is transferred from the chamber 202 to the chamber 203. The substrate holder 221 is transferred to the p-type semiconductor layer deposition chamber 217 of the chamber 203, and the substrate is heated to a desired temperature with the heater 214. The deposition chamber 217 is supplied with source gases for p-type semiconductor layer deposition at a desired flow rate, and an RF energy is introduced into the deposition chamber 217 while maintaining a desired degree of vacuum in the deposition chamber 217. Then the p-type semiconductor layer 106 is deposited in a desired layer thickness. After depositing the p-type semiconductor layer 106, the deposition chamber 217 is exhausted sufficiently, and the substrate holder 227 is transferred to the n-type semiconductor layer deposition chamber 215 within the same chamber 203. An n-type semiconductor layer 105 is deposited on the p-type semiconductor layer 106 in the same way as the n-type semiconductor layer 108 mentioned previously. The deposition chamber 215 is exhausted sufficiently, and the substrate holder 221 is transferred to the i-type semiconductor layer deposition chamber 216. The substrate is heated to a desired temperature with the heater 213. The deposition chamber 216 is supplied with source gases for i-type semiconductor layer deposition at a desired flow rate, and a desired RF energy is introduced while maintaining a desired pressure in the deposition chamber 216. Thereby the i-type semiconductor layer 104 is deposited in a desired film thickness on the n-type semiconductor layer 105. Next, the deposition chamber 216 is exhausted sufficiently; the substrate holder 221 is transferred from the deposition chamber 216 to the deposition chamber 217; and a p-type semiconductor layer 103 is deposited on the i-type semiconductor layer 104 in the same way as the p-type semiconductor layer 106 mentioned previously. After exhausting the deposition chamber 217 sufficiently in the same manner as mentioned previously, the gate valves 208 and 209 are opened, and the substrate holder 221 having set thereon the substrate with deposited semiconductor layers is transferred to the unloading chamber 205. All of the gate valves are closed, nitrogen gas is introduced into the unloading chamber 205; and the substrate is cooled to a desired temperature. Afterwards, the taking out valve of the unloading chamber 205 is opened to take out the substrate holder 221. Using a vaporizer for transparent electrode deposition (not shown), a transparent electrode 102 is deposited on the p-type semiconductor layer 103 in a desired layer thickness. Then, using the vaporizer (not shown) in the same way, a collector electrode 101 is deposited on the transparent electrode 102.

Incidentally, when the microcrystalline i-type semiconductor layer 107 is formed by use of silicon germanium instead of silicon, the chamber 204 may be used instead of the chamber 202.

Further, a semiconductor element having a semiconductor junction within microcrystal grains may also be formed in the following ways.

(1) A crystalline semiconductor layer having first electric characteristics (a doped semiconductor layer), and then a microcrystalline semiconductor layer having second electric characteristics (a non-doped microcrystalline semiconductor layer or a microcrystalline semiconductor layer having different electric characteristics from the first doped semiconductor layer) is deposited by changing the source gases under conditions such that microcrystals grow continuously, thus forming a semiconductor junction within the microcrystal grains.

(2) A crystalline semiconductor layer having first electric characteristics is formed; a microcrystalline or amorphous semiconductor layer having second electric characteristics is formed on the semiconductor layer; and the both semiconductor layers are annealed at a temperature below the melting points, thus forming a semiconductor junction within the microcrystal grains.

(3) A microcrystalline semiconductor layer having first electric characteristics is formed; hydrogen plasma treatment is applied onto the semiconductor layer to clean the surface of the microcrystalline semiconductor layer having the first electric characteristics; and then a microcrystalline semiconductor layer having second electric characteristics is epitaxially grown on the microcrystalline semiconductor layer having the first electric characteristics to form a semiconductor junction within the microcrystal grains.

(4) An amorphous or crystalline semiconductor layer having first electric characteristics is formed; an amorphous or microcrystalline semiconductor layer having second electric characteristics is deposited on the semiconductor layer; and then recrystallization with an excimer laser (laser annealing) is carried out to form a semiconductor junction within the microcrystal grains.

As the energy density of laser in recrystallization with an excimer laser, 200 mJ/cm$^2$ to 800 mJ/cm$^2$ is preferred. The total layer thickness of the first and the second semiconductor layers when effecting the laser annealing is preferably 100 Å to 700 Å. After recrystallization, epitaxially growing on the semiconductor layer with the second electric characteristics a semiconductor layer with the same electric characteristics makes it possible to increase the layer thickness of the semiconductor layer having the second electric characteristics. When performing the laser annealing, it is preferable to increase the environment temperature, specifically to 100–800° C. Particularly, when a supporting member (substrate) with low heat resistance properties such as stainless thin film or glass is used, the environment temperature is preferably 100–600° C. Such lasers as ArF (wavelength: 193 nm), KrF (wavelength: 248 nm), XeCl (wavelength: 308 nm), or XeF (wavelength: 351 nm) are included as suitable ones for laser annealing. When annealing a silicon type semiconductor layer, XeCl (wavelength: 308 nm) is particularly preferable.

(5) A crystalline semiconductor with first electric characteristics is formed and ion implanting an impurity (a dopant) in the semiconductor enables formation of a semiconductor junction within the same semiconductor.

In this case, it is preferred that after ion implantation, thermal annealing is carried out within a range of 100 to 800° C.

The present invention can be applied to formation of not only semiconductor junctions where one layer is not doped such as p/i or n/i junction, but also semiconductor junctions where the layers have opposite electric characteristics such as n/p junction, or semiconductor junctions where the layers have the same electric characteristics such as n/n or p/p but are different in dopant concentration from each other.

The microcrystalline semiconductor layer comprised of microcrystal grains with different grain diameters can be formed in the following ways, for example.

(1) During the process of depositing a microcrystalline semiconductor layer while diluting a source gas with a large amount of hydrogen, the power applied to the plasma is periodically changed.

By doing so, at portions of the growing surface of the semiconductor layer where crystals will grow with difficulty, the crystal growth is promoted by the active hydrogen. As a result, the semiconductor layer is filled with microcrystal grains having different grain diameters.

The applied power is preferably changed with 1.1 to 2 times the value before the change being the maximum value. If it is changed by a factor over 2 times, there is a possibility that the influence on the growing surface of the semiconductor may be so large as to increase defect states.

(2) A microcrystalline semiconductor layer is deposited while adding a halogen-containing gas to the source gases at regular intervals.

By doing so, it is possible to activate the growing surface of the semiconductor layer where crystal growth is difficult to promote the crystal growth. As a result, the semiconductor layer is filled with microcrystal grains of different crystal diameters.

When adding the halogen-containing gas, it is preferable to add it at a ratio (volume concentration) of 0.2 to 0.9 times the source gas not containing a halogen. If the addition amount of the halogen-containing gas exceeds this range, the plasma will be unstable and there is a possibility that a desired semiconductor film may not be obtained.

The semiconductor layers adjacent to the semiconductor junction within the microcrystal grains (a semiconductor layer having first electric characteristics and a semiconductor layer having second electric characteristics) can be either amorphous or crystalline during deposition if crystallization is carried out by a post-treatment. If no crystallization by a post-treatment is carried out, they need to be crystalline during deposition. When they are made crystalline during deposition, they are preferably microcrystalline semiconductors.

The average crystal grain diameter of the microcrystal grains is preferably 100 Å to 1000 Å when obtained by calculation using the Scherrer's equation from the half-width of the X-ray diffraction (220) peak. If the average diameter is determined from the dark field image of a transmission electron microscope, it is preferably within 100 Å to 10 $\mu$m. When the average crystal grain diameter of columnar microcrystals is determined using a transmission electron microscope, it is preferred that a geometric mean of the long axis and the short axis thereof is within the above range.

Further, the preferred proportion of amorphous phase contained in the microcrystalline semiconductor is such that when observed with the Raman spectrum, the ratio of amorphous phase related peaks to crystal phase related peaks is not more than 70%. If the average crystalline grain diameter is less than 100 Å, more amorphous phase related peaks will exist on the crystal grain boundaries and photo-deterioration is liable to occur. Also, if the crystal grain diameter is too small, there is a possibility that the mobility and lifetime of electrons and positive holes may be smaller to lower the characteristics as semiconductor. On the other hand, if the average crystal grain diameter calculated using the Scherrer's equation is greater than 1000 Å, there is a possibility that relaxation of the crystal grain boundaries may not progress sufficiently, defects such as dangling bonds may arise in the crystal grain boundaries, and the defects may act as recombination centers for electrons or positive holes, whereby the characteristics of the microcrystalline semiconductor may be lowered. As the shape of microcrystals, a shape which is long and thin (columnar) in the direction of movement of the charge is preferred. In addition, the proportion of hydrogen atoms or halogen atoms contained in the microcrystalline semiconductor layer of the present invention is preferably not more than 30%.

The semiconductor layers used in the semiconductor element of the present invention include a doped layer such as a p-type semiconductor layer or n-type semiconductor layer, an i-type semiconductor layer, or the like.

When the present invention is applied to a photovoltaic element, the doped layer is an important layer that influences the characteristics of the element, and the i-type semiconductor layer is also another important layer for carrier generation and transportation by light incidence.

As the amorphous semiconductor materials, microcrystalline semiconductor materials and polycrystalline semiconductor materials that can preferably be applied to the semiconductor element of the present invention, there are included, for example, a-Si:H, a-Si:HX, a-SiC:H, a-SiC:HX, a-SIGe:H, a-SiGeC:H, a-SiO:H, a-SiN:H, a-SiON:HX, a-SiOCN:HX, $\mu$c-Si:H, $\mu$c-SiC:H, $\mu$c-Si:HX, $\mu$c-SiC:HX, $\mu$c-SiGe:H, $\mu$c-SiO:H, $\mu$c-SiGeC:H, $\mu$c-SiN:H, $\mu$c-SiON:HX, $\mu$c-SiOCN:HX, poly-Si:H, poly-Si:HX, poly-SiC:H, poly-SiC:HX, poly-SiGe:H, poly-Si, poly-SiC, and poly-SiGe can be used favorably.

When these materials are applied to doped layers, it is preferable to add a p-type valency controller (Group III atoms of Periodic Table: B, Al, Ga, In, or Tl) or an n-type valency controller (Group V atoms of Periodic Table: P, As, Sb, or Bi) at a high concentration. The content of Group III atoms in the p-type semiconductor layer and Group V atoms in the n-type semiconductor layer is preferably 0.1 to 50 atomic %.

Further, the hydrogen atoms (H, D) and/or the halogen atoms (F, Cl, etc.) contained in the p-type semiconductor layer or the n-type semiconductor layer have a function of compensating for the dangling bonds of the p-type or the n-type semiconductor layer, thus improving the doping efficiency of the p-type or n-type semiconductor layer. The content of the hydrogen atoms and/or halogen atoms in the p-type or n-type semiconductor layer is preferably 0.1 to 40 atomic %. In particular, when the p-type or n-type semiconductor layer is crystalline, the content of hydrogen atoms and/or halogen atoms is preferably 0.1 to 8 atomic %.

Further, for the semiconductor layers of the semiconductor element of the present invention, it is preferred that the content of the hydrogen atoms (H, D) and/or the halogen atoms (F, Cl, etc.) is larger in the vicinity of each of the interfaces of p-type semiconductor layer/i-type semiconductor layer or n-type semiconductor layer/i-type semiconductor layer. Preferably, the content of the hydrogen atoms and/or halogen atoms in the vicinity of the interfaces is preferably within a range of 1.1 to 2 times the content of the bulk area in the case of the p-type semiconductor layer or the n-type semiconductor layer, and is preferably within a range of 1.1 to 2 times the content of the bulk area in the case of the i-type semiconductor layer. Such larger contents of hydrogen atoms or halogen atoms in the vicinity of the interfaces (p-type semiconductor layer/i-type semiconductor layer, n-type semiconductor layer/i-type semiconductor layer) can reduce defect states and mechanical distortions in the vicinity of the interfaces, thereby improving the characteristics of the semiconductor element of the present invention.

When a multiple-element (alloy) semiconductor layer such as SiC, SiGe, etc., is used, it is preferable that the content of hydrogen atoms and/or halogen atoms is changed in response to the change in content of silicon atoms. In the semiconductor layer, depending on the bandgap, the content of hydrogen atoms and/or halogen atoms is smaller at a portion of narrow bandgap. Incidentally, it is preferred that the content of the hydrogen atoms and/or halogen atoms at a portion where the content of silicon atoms is the minimum is 1 to 10 atomic % and is 0.3 to 0.8 times the content at a portion where the content of hydrogen atoms and/or halogen atoms is the maximum.

Although the details of the mechanism are not clear, it is considered that when an alloy semiconductor containing silicon atoms and germanium atoms is deposited, a difference arises in the electromagnetic wave energies acquired by each of the atoms due to the differences in ionization rates of the silicon atoms and germanium atoms, with the result that even if the content of the hydrogen and/or halogen in the alloy semiconductor is small, the relaxation proceeds sufficiently to provide a high quality alloy semiconductor.

The preferred electric characteristics for the p-type semiconductor layer and the n-type semiconductor layer when applying the semiconductor element of the present invention to a photovoltaic element is such that the activation energy is not more than 0.2 eV, optimally not more than 0.1 eV. The resistivity is preferably not more than 100 Ωcm, optimally not more than 1 Ωcm. The layer thickness of the p-type semiconductor layer and the n-type semiconductor layer is preferably 1 to 50 nm, optimally 3 to 10 nm.

As the p-type semiconductor layer or the n-type semiconductor layer on the light incidence side, a crystalline semiconductor layer with less absorption of light or an amorphous semiconductor layer with a large bandgap is suitable.

As the i-type semiconductor layer in the semiconductor element of the present invention, a semiconductor layer that is slightly of the p-type or n-type (i.e., substantially i-type semiconductor layer) can be used (whether it becomes the p-type or n-type depends on the distribution of characteristic defects such as tail state).

As the i-type semiconductor layer when the semiconductor element of the present invention is applied to a photovoltaic element, there can suitably be used, in addition to semiconductors with a uniform bandgap, those semiconductors which contain silicon atoms and germanium atoms such that the bandgap changes smoothly in the direction of layer thickness of the i-type semiconductor layer, and that the minimum of the bandgap is offset from the central position of the i-type semiconductor layer toward the interface between the p-type semiconductor layer and the i-type semiconductor layer. Further, a semiconductor layer doped with both a valency controller to be a donor and a valency controller to be an acceptor is also suitable as the i-type semiconductor layer.

Further, it is preferred that the bandgap of the i-type semiconductor layer is so designed that it becomes greater toward each of the interfaces of p-type semiconductor layer/i-type semiconductor layer and n-type semiconductor/i-type semiconductor layer. Such design makes it possible to increase the photovoltage and photocurrent of the photovoltaic element and to prevent photodeterioration in long-term use, or the like.

The preferred layer thickness of the i-type semiconductor layer in the case of a photovoltaic element depends largely on the structure of the element (for example single cell, tandem cell, or triple cell) and on the bandgap of the i-type semiconductor layer, but 0.7 to 30.0 μm is a suitable thickness.

Next, as the preferred methods for deposition of semiconductor layers of the semiconductor element of the present invention, there are included RF plasma CVD, VHF plasma CVD, and microwave plasma CVD. The preferred range for the frequency of RF and VHF is 1 MHz to 300 MHz. For RF, a frequency in the vicinity of 13.56 MHz is optimal, and for VHF a frequency in the vicinity of 105 MHz is optimal. For the microwave, 0.5 GHz to 10 GHz is a preferred frequency range.

In particular, when depositing microcrystalline silicon, since the deposition rate depends on the electromagnetic wave used and becomes larger with increasing frequency in a given input energy, using high frequency electromagnetic waves is suitable.

As the source gases suitable for deposition of the semiconductor layers of the semiconductor element of the present invention, there can be included a gas comprised of a gasifiable compound containing silicon atoms, a gas comprised of a gasifiable compound containing germanium atoms, a gas comprised of a gasifiable compound containing carbon atoms, or a mixture gas thereof.

As the compounds which contain silicon atoms and are gasifiable, there are included, for example, $SiH_4$, $Si_2H_6$, $Si_3H_8$, $SiF_4$, $SiHF_3$, $SiH_2F_2$, $SiH_3F$, $SiH_3Cl$, $SiH_2Cl_2$, $SiHCl_3$, $SiCl_4$, $SiD_4$, $SiHD_3$, $SiH_2D_2$, $SiH_3D$, $SiD_3F$, $SiD_2F_2$, $Si_2H_3D_2$, etc.

As the compounds which contain germanium atoms and are gasifiable, there are included, for example, germanium compounds such as $GeH_4$, $GeF_4$, $GeHF_3$, $GeH_2F_2$, $GeH_3F$, $GeHCl_3$, $GeH_2Cl_2$, $GeH_3Cl$, $GeHD_3$, $GeH_2D_2$, $GeH_3D$, $GeD_4$, $Ge_2H_6$, $Ge_2D_6$, etc.

As the compounds which contain carbon atoms and are gasifiable, there are included, for example, compounds represented by $C_nH_{2n+2}$ (n is an integer) such as $CH_4$, etc., compounds represented by $C_nH_{2n}$ (n is an integer) such as $C_2H_2$, etc., and $CD_4$, $C_6H_6$, $CO_2$, CO, or the like.

Further, the source gases may contain a gas that contains nitrogen atoms or a gas that contains oxygen atoms.

The gases containing nitrogen atoms include $N_2$, $NH_3$, $ND_3$, NO, $NO_2$, $N_2O$, etc.

The gases containing oxygen atoms include $O_2$, CO, $CO_2$, NO, $NO_2$, $N_2O$, $CH_3CH_2OH$, $CH_3OH$, etc.

Further, the above gasifiable compounds may be suitably diluted with such gases as $H_2$, He, Ne, Ar, Xe, or Kr to be introduced into the deposition chamber.

In particular, when depositing a microcrystalline semiconductor layer of the present invention, it is preferred that these source gases are diluted with hydrogen gas or helium gas in order to form a good microcrystalline semiconductor. The dilution rate with hydrogen gas is preferably 10 or more fold. The especially preferred range of dilution rate is from 10 to 100 fold. If the dilution rate is too small, formation of microcrystals becomes difficult and amorphous phase is liable to be formed. On the other hand, if the dilution rate is too large, the microcrystal deposition rate is too small and problems in practical use arise.

In particular, when depositing microcrystalline semiconductor or a semiconductor layer with less light absorption or with a large bandgap such as a-SiC:H or the like, it is preferable to dilute the source gas 2 to 100 fold with hydrogen gas, etc. and to make the input RF power, VHF power, or microwave power relatively high.

When depositing a p-type semiconductor layer or an n-type semiconductor layer, it is preferable to add a compound that contains a valency controller (Group III or Group V atoms of Periodic Table) to the source gases in order to effect valency control.

As the compounds for introducing Group III atoms, there can effectively be used boron hydrides such as $B_2H_6$, $B_4H_{10}$, $B_5H_9$, $B_5H_{11}$, $B_6H_{10}$, $B_6H_{12}$, $B_6H_{14}$, or boron halides such as $BF_3$, $BCl_3$, etc. for boron atom introduction. In addition, such compounds as $AlCl_3$, $GaCl_3$, $InCl_3$, or $TlCl_3$ can be included as compounds for introducing Group III atoms other than boron. Of these compounds $B_2H_6$ and $BF_3$ are especially suitable.

As the compounds for introducing Group V atoms, there can effectively be used phosphorous hydrides such as $PH_3$, $P_2H_4$, etc. and phosphorous halides such as $PH_4I$, $PF_3$, $PF_5$, $PCl_3$, $PCl_5$, $PBr_3$, $PBr_5$, $PI_3$, etc. for phosphorous atom introduction. In addition, such compounds as $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$ can be included as compounds for introducing Group V atoms other than phosphorous. Of these compounds $PH_3$ and $PF_3$ are especially suitable.

When depositing a semiconductor layer with the RF plasma CVD method mentioned previously, the preferred deposition conditions are such that the substrate temperature in the deposition chamber is 100 to 350° C.; the internal pressure is 0.1 to 10 Torr, the RF power is 0.01 to 5.0 W/cm$^2$, and the deposition rate is 0.1 to 30 Å/sec. Further, when depositing a semiconductor layer with the RF plasma CVD method, the capacitive coupled RF plasma CVD method is suitably used.

When depositing a semiconductor layer with the microwave plasma CVD method, the preferred deposition conditions are such that the substrate temperature in the deposition chamber is 100 to 400° C., the internal pressure is 0.5 to 30 mTorr, and the microwave power is 0.01 to 1.0 W/cm$^3$. As the microwave plasma CVD apparatus used when depositing a semiconductor layer by microwave plasma CVD method, a method is suitable in which the microwaves are introduced by a waveguide through a dielectric window (such as of aluminum ceramics) into the deposition chamber.

The substrate temperature for depositing a microcrystalline semiconductor layer suited to the present invention is 100 to 500° C. It is desirable that when increasing the deposition rate is desired, the substrate is kept at a relatively high temperature. As a suitable range for degree of vacuum in the chamber during deposition of the microcrystalline semiconductor layer of the present invention, the range of 1 mTorr–1 Torr is included. Especially when depositing the microcrystalline semiconductor layer by the microwave plasma CVD method, 1 mTorr–10 mTorr is preferable as the degree of vacuum.

As a suitable range for input power for the chamber when depositing the microcrystalline semiconductor layer of the present invention, 0.01–10 W/cm$^3$ is included. When it is defined by the relationship of source gas flow rate and input power, the power limited region is suitable in which the deposition rate depends on the input power.

Further, the distance between the substrate and the electrodes for power input is an important factor in the deposition of the microcrystalline semiconductor layer of the present invention. In order to obtain a microcrystalline layer suited to the present invention it is preferred to set the distance to be 10 mm–50 mm.

The i-type semiconductor layer containing silicon atoms or germanium atoms formed by the above-described deposited film formation method is such that there are less tail states on the valence band side even when the deposition rate is over 5 nm/sec, that the tail states have an inclination of not more than 60 meV, and that the density of dangling bonds determined by the electron spin resonance (esr) is not more than $10^{17}$/cm$^3$.

The present invention is explained in detail below based on Examples. Of course, it is to be understood that the present invention is not limited to the following examples.

EXAMPLE 1

In this example, a photovoltaic element was produced using the deposited film forming apparatus shown in FIG. 2. The deposition conditions of each of the semiconductor layers are shown in Table 1. The formation of the members such as electrodes in all the examples including this example and comparative examples was accomplished using a conventional method. The microcrystalline semiconductor having a semiconductor junction within the same microcrystalline semiconductor of the present invention was used between the n-type semiconductor layer n1 and an i-type semiconductor layer i1 of the bottom photovoltaic element. After deposition of the n-type semiconductor layer n1, the n-type semiconductor layer n1 was irradiated with an excimer laser under the conditions shown in Table 2 in the loading chamber to crystallize the n-type semiconductor layer n1. Afterwards, the i-type semiconductor layer i1 was successively deposited on the n-type semiconductor layer n1 by VHF plasma CVD.

COMPARATIVE EXAMPLE 1

A photovoltaic element for comparison with Example 1 was produced in a similar manner to that of Example 1 with the exception that the n-type semiconductor layer n1 was not treated with an excimer laser.

COMPARISON of EXAMPLE 1 with COMPARATIVE EXAMPLE 1

The characteristics of the photovoltaic element thus formed were measured and evaluated using WXS-130S-20T (trade name; mfd. by WACOM CO.) as a light source. The spectrum of the light source was AM 1.5 and the light intensity was 1 sun. The results are shown in Table 3 in terms of relative values when the results of Comparative Example 1 are expressed as 1. The photovoltaic element of Example 1 comprising microcrystalline semiconductor with a semiconductor junction within the same microcrystalline semiconductor of the present invention showed excellent photovoltaic characteristics compared to the Comparative Example 1 element. Further, as compared with the Comparative Example 1 element, the photovoltaic element of Example 1 had a lower series resistance and a larger shunt resistance.

Then, 100 photovoltaic elements each were produced under the same conditions as Example 1 and Comparative Example 1. These photovoltaic elements were allowed to stand for 2000 hours in an atmosphere containing acetic acid at 85° C. temperature and 85% humidity. Afterwards, the photovoltaic characteristics were measured. Compared to the elements of Comparative Example 1, the characteristics of the 100 photovoltaic elements of Example 1 showed an extremely small variance. In other words, the photovoltaic elements of the present invention had an extremely high resistance to environment (durability).

When a cross-section of each of these photovoltaic elements was observed with a transmission electron microscope, it was confirmed for the photovoltaic elements of Example 1 that the region thought to be the boundary between the n-type semiconductor layer and the i-type semiconductor layer was constituted of microcrystal grains with a length in the layer thickness direction of 2000–4000 Å. Further, it was confirmed through secondary ion mass spectroscopy that the impurities (dopant) were localized on the substrate side of the microcrystal grains.

EXAMPLE 2

A photovoltaic element was produced under the deposited film formation conditions shown in Table 4 using the deposited film forming apparatus of FIG. 2 in the same manner as in Example 1. The n-type semiconductor layer n1 was irradiated with an excimer laser under the conditions shown in Table 5 to crystallize it in a similar manner to that of Example 1. A bottom i-type semiconductor layer i1 was deposited thereon by the so-called HRCVD method in which hydrogen gas was activated with microwave plasma and reacted with SiF$_4$ to deposit a semiconductor layer.

COMPARATIVE EXAMPLE 2

A photovoltaic element was produced in a similar manner to that of Example 2 with the exception that the n-type semiconductor layer n1 was not treated with a laser.

COMPARISON of EXAMPLE 2 and COMPARATIVE EXAMPLE 2

The photovoltaic element characteristics of these photovoltaic elements were measured in a similar manner to that of Example 1 and Comparative Example 1. The results are shown in Table 6 in terms of relative values when the results of Comparative Example 2 are expressed as 1. The photovoltaic element of Example 2 showed superior photovoltaic characteristics in comparison to the Comparative Example 2 element.

Further, a cross-section of each of these photovoltaic elements was observed with an electron microscope and the amount of impurities was measured by secondary ion mass spectroscopy. As a result, it was confirmed for the photovoltaic element of Example 2 that a portion of each of the n-type semiconductor layer and the i-type semiconductor layer were formed within the same microcrystal grains. The shape of the microcrystal grains was columnar, the length in the layer thickness direction was 3000 Å, and the length in the direction perpendicular to the layer thickness direction was 300 Å.

EXAMPLE 3

A photovoltaic element was produced in a similar manner to that of Example 1 with the exception that in place of the method of Example 1 in which the i-type semiconductor layer i1 was stacked on the n-type semiconductor layer n1 crystallized by laser, a method was used in which after depositing the n-type semiconductor layer n1, a hydrogen plasma treatment shown in Table 7 was performed in the i-type semiconductor layer deposition chamber 202, and a source gas for formation of an i-type semiconductor layer was added without discontinuing the discharge to deposit the i-type semiconductor layer i1.

COMPARISON of EXAMPLE 3 and COMPARATIVE EXAMPLE 1

The photovoltaic characteristics of the photovoltaic element of Example 3 were evaluated in a similar manner to that of Example 1. The results are shown in Table 8 in terms of relative values when the results of Comparative Example 1 are expressed as 1.

As is clear from Table 8, the photovoltaic element of Example 3 showed superior photovoltaic characteristics.

EXAMPLE 4

Using the deposited film forming apparatus shown in FIG. 2, a photovoltaic element was formed under the deposited film formation conditions shown in Table 9. After depositing a microcrystalline i-type semiconductor layer (i0 layer), phosphorus atoms were implanted into the i0 layer under the conditions shown in Table 10 with an ion implantation apparatus not shown, followed by annealing to activate the phosphorus atoms.

COMPARISON of EXAMPLE 4 and COMPARATIVE EXAMPLE 1

The photovoltaic characteristics of the photovoltaic element of Example 4 were evaluated in a similar manner to that of Example 1. The results are shown in Table 11 in terms of relative values when the results of Comparative Example 1 are expressed as 1.

As is clear from Table 11, the photovoltaic element of Example 4 showed superior photovoltaic characteristics.

When a cross section of the photovoltaic element of Example 4 was observed with an electron microscope, it was confirmed for the i0 layer that uniform microcrystal grains were formed extending over the whole in the layer thickness direction in a layer thickness of 3000 Å. It was further confirmed through secondary ion mass spectroscopy that the implanted phosphorus atoms were distributed only on the substrate side, namely that a semiconductor junction was formed within a single microcrystal grain.

EXAMPLE 5

Using the deposited film forming apparatus shown in FIG. 2, a photovoltaic element was formed under the deposited film formation conditions shown in Table 12. The microcrystalline semiconductor having a semiconductor junction within the same microcrystal grain was used between the n-type and the i-type semiconductor layers n1 and i1 of the bottom photovoltaic element. After deposition of the n-type semiconductor layer n1, the n-type semiconductor layer n1 was irradiated with an excimer laser under the conditions shown in Table 2 in the loading chamber to crystallize the n-type semiconductor layer n1. Afterwards, an i-type semiconductor layer i1 was successively deposited on the n-type semiconductor layer n0 with the VHF plasma CVD method.

COMPARATIVE EXAMPLE 3

A photovoltaic element for comparison with Example 5 was produced in a similar manner to that of Example 5 with the exception that the n-type semiconductor layer was not treated with an excimer laser.

COMPARISON of EXAMPLE 5 and COMPARATIVE EXAMPLE 3

The photovoltaic element characteristics of these photovoltaic elements were measured in a similar manner to that of Example 1 and Comparative Example 1. These results are shown in Table 13 in terms of relative values when the results of Comparative Example 3 are expressed as 1. The photovoltaic element of Example 5 showed photovoltaic characteristics superior to the element of Comparative Example 3. Also, the photovoltaic element of the present invention had lower series resistance and larger shunt resistance in comparison with the element of Comparative Example 3.

One hundred photovoltaic elements each were then produced under the same conditions as Example 5 and Comparative Example 3. These photovoltaic elements were then left for 2000 hours in an atmosphere of 85° C. temperature and 85% humidity. Afterwards their photovoltaic characteristics were measured. The 100 photovoltaic elements of Example 5 had an extremely small variance of the characteristics as compared with the elements of Comparative Example 3. In other words, the photovoltaic elements of the present invention have extremely high resistance to environment (durability).

When a cross-section of each of these photovoltaic elements was observed with a transmission electron microscope, it was confirmed for the photovoltaic elements of Example 5 that the region thought to be the boundary between the n-type semiconductor layer and the i-type semiconductor layer was constituted of microcrystal grains 2000–5000 Å long in the film thickness direction. It was also confirmed through secondary ion mass spectroscopy that the impurities (dopant) were localized on the substrate side of these microcrystal grains.

EXAMPLE 6

A photovoltaic element was produced in a similar manner to that of Example 1 with the exception that after depositing the p-type semiconductor layer, the p-type semiconductor layer was irradiated with an excimer laser under the same conditions of laser irradiation as the crystallization of the n-type semiconductor layer, i.e., the conditions shown in Table 2. Through this irradiation a microcrystalline layer was formed having a semiconductor junction within the microcrystal grain, further between the i-type semiconductor layer and the p-type semiconductor layer.

COMPARISON of EXAMPLE 6 with EXAMPLE 1 and COMPARATIVE EXAMPLE 1

The photovoltaic element of Example 6 was evaluated in a similar manner to that of Example 1. These results are shown in Table 14 in terms of relative values when the results of Comparative Example 1 are expressed as 1. The photovoltaic element of Example 6 showed excellent characteristics in comparison with the element of Comparative Example 1 and the element of Example 1.

A transmission electron microscope and a secondary ion mass spectrometer were used to confirm whether or not a semiconductor junction was formed within the same microcrystal grain in the photovoltaic element of this example. As a result, it was confirmed that the element of this example had the n-type semiconductor layer and the i-type semiconductor layer within the same microcrystal grains and had the i-type semiconductor layer and the p-type semiconductor layer within the same microcrystal grains.

From the above, it was confirmed that the photovoltaic element having the n-type semiconductor layer and the i-type semiconductor layer within the same microcrystal grains and having the i-type semiconductor layer and the p-type semiconductor layer within the same microcrystal grains has the best characteristics.

One hundred photovoltaic elements each of Example 6 and Comparative Example 1 were then produced, and left for 3000 hours in an atmosphere of a nitrogen oxide at 85° C. temperature and 95% humidity while irradiating them with light of AM 1.5 and 100 mW/cm². Afterwards their photovoltaic characteristics were measured. The photovoltaic elements of Example 6 had less change in characteristics than the elements of Comparative Example 1.

Further, the current values when a 2V reverse bias was applied to the photovoltaic elements of Example 6 and the elements of Comparative Example 1 were compared. The results showed that the current values of the photovoltaic elements of Example 6 were approximately one order lower than those for the elements of Comparative Example 1.

EXAMPLE 7

In this example, a photovoltaic element was produced using the deposited film forming apparatus shown in FIG. 2. The deposition conditions of each of the semiconductor layers are shown in Table 15. The formation of the members such as electrodes in all the examples including this example and comparative examples was accomplished using a conventional method. When depositing the bottom photovoltaic element, the input power was changed every 6 seconds between the numerical value shown in Table 15 and a numerical value 1.5 times that. The microcrystalline semiconductor having a semiconductor junction within the same microcrystalline semiconductor of the present invention was used between the n-type semiconductor layer n1 and an i-type semiconductor layer i1 of the bottom photovoltaic element. After deposition of the n-type semiconductor layer n1, the n-type semiconductor layer n1 was irradiated with an excimer laser under the conditions shown in Table 16 in the loading chamber to crystallize the n-type semiconductor layer n1. Afterwards, the i-type semiconductor layer i1 was successively deposited on the n-type semiconductor layer n1 by VHF plasma CVD.

COMPARATIVE EXAMPLE 4

A photovoltaic element for comparison with Example 7 was produced in a similar manner to that of Example 7 with the exception that the input power was set at the constant value shown in Table 15 and that the n-type semiconductor layer n1 was not treated with an excimer laser.

COMPARISON of EXAMPLE 7 with COMPARATIVE EXAMPLE 4

The characteristics of the photovoltaic elements thus formed were measured and evaluated using WXS-130S-20T (trade name; mfd. by WACOM CO.) as a light source. The spectrum of the light source was AM 1.5 and the light intensity was 1 sun. The results are shown in Table 17 in terms of relative values when the results of Comparative Example 4 are expressed as 1. The photovoltaic element of Example 7 showed excellent photovoltaic characteristics as compared to the Comparative Example 4 element. Further, as compared to the Comparative Example 4 element, the photovoltaic element of Example 7 had a lower series resistance and a larger shunt resistance.

One hundred photovoltaic elements each were then produced under the same conditions of Example 7 and Comparative Example 4. These photovoltaic elements were left for 2000 hours in an atmosphere containing acetic acid at 85° C. temperature and 85% humidity. Afterwards the photovoltaic characteristics were measured. Compared to the elements of Comparative Example 4, the characteristics of the 100 photovoltaic elements of Example 7 showed an extremely small variance. In other words, the photovoltaic elements of the present invention had an extremely high resistance to environment (durability).

When a cross-section of each of these photovoltaic elements was observed with a transmission electron microscope, it was confirmed for the photovoltaic elements of Example 7 that the region thought to be the boundary between the n-type semiconductor layer and the i-type semiconductor layer was constituted of microcrystal grains with a length in the layer thickness direction of 2000–4000 Å. Further, through secondary ion mass spectroscopy, it was confirmed that the impurities (dopant) were localized on the substrate side of the microcrystal grains.

Further, it was confirmed through the dark-field image of an electron microscope that microcrystal grains with different sizes were distributed within the semiconductor layers of the bottom photovoltaic element of Example 7. On the other hand it was also confirmed that microcrystal grains of a uniform size were distributed in the semiconductor layers of the bottom photovoltaic element of Comparative Example 4.

EXAMPLE 8

A photovoltaic element was produced under the deposited film formation conditions shown in Table 18 using the deposited film forming apparatus of FIG. 2 in the same manner as in Example 7. The n-type semiconductor layer n1 was irradiated with an excimer laser under the conditions shown in Table 19 to be crystallized in a similar manner to that of Example 7. A bottom i-type semiconductor layer i1 was deposited thereon by the so-called HRCVD method in which hydrogen gas was activated with microwave plasma and reacted with $SiF_4$ to deposit a semiconductor layer. When depositing the bottom i-type semiconductor layer i1, the microwave energy was changed every 6 seconds between the value shown in Table 18 and a value of 1.3 times the value of Table 18.

COMPARATIVE EXAMPLE 5

A photovoltaic element for comparison with Example 8 was produced in a similar manner to that of Example 8 with the exception that the microwave power during deposition of the i-type semiconductor layer i1 was set at the constant value shown in Table 18 and that the n-type semiconductor layer n1 was not treated with an excimer laser.

COMPARISON of EXAMPLE 8 and COMPARATIVE EXAMPLE 5

The photovoltaic element characteristics of these photovoltaic elements were measured in a similar manner to that of Example 7 and Comparative Example 4. The results are shown in Table 20 in terms of relative values when the results of Comparative Example 5 are expressed as 1. The photovoltaic element of Example 8 showed superior photovoltaic characteristics in comparison to the Comparative Example 5 element.

Further, a cross-section of each of these photovoltaic elements was observed with an electron microscope and the amount of impurities was measured by secondary ion mass spectroscopy. As a result, it was confirmed for the photovoltaic element of Example 8 that a portion of each of the n-type semiconductor layer and the i-type semiconductor layer were formed within the same microcrystal grains. The shape of the microcrystal grains was columnar, the length in the layer thickness direction was 3000 Å, and the length in the direction perpendicular to the layer thickness direction was 300 Å.

Further, when the dark field image of these photovoltaic elements was observed with a transmission electron microscope, spaces unfilled by microcrystal grains in the photovoltaic elements of Comparative Example 5 were observed, but in Example 8 the spaces were filled by microcrystals with different grain diameters.

EXAMPLE 9

A photovoltaic element was produced in a similar manner to that of Example 7 with the exception that in place of the method of Example 7 in which the i-type semiconductor layer i1 was stacked on the n-type semiconductor layer n1 crystallized by laser, a method was used in which after depositing the n-type semiconductor layer n1, a hydrogen plasma treatment shown in Table 21 was performed in the i-type semiconductor layer deposition chamber 202, and a source gas for formation of an i-type semiconductor layer was added without discontinuing the discharge to deposit the i-type semiconductor layer i1.

COMPARISON of EXAMPLE 9 and COMPARATIVE EXAMPLE 4

The photovoltaic characteristics of the photovoltaic element of Example 9 were evaluated in a similar manner to that of Example 7. The results are shown in Table 22 in terms of relative values when the results of Comparative Example 4 are expressed as 1.

As is clear from Table 22, the photovoltaic element of Example 9 showed superior photovoltaic characteristics.

EXAMPLE 10

Using the deposited film forming apparatus shown in FIG. 2, a photovoltaic element was formed under the deposited film formation conditions shown in Table 23. After depositing a microcrystalline i-type semiconductor layer (i0 layer), phosphorus atoms were implanted into the i0 layer under the conditions shown in Table 24 with an ion implantation apparatus not shown, followed by annealing to activate the phosphorus atoms. When depositing the layer i0, $SiF_4$ gas of 50% of the silane gas was added at a rate of 10 times per minute for one second per addition.

COMPARISON of EXAMPLE 10 and COMPARATIVE EXAMPLE 4

The photovoltaic characteristics of the photovoltaic element of Example 10 were evaluated in a similar manner to that of Example 7. The results are shown in Table 25 in terms of relative values when the results of Comparative Example 4 are expressed as 1.

As is clear from Table 25, the photovoltaic element of Example 10 showed superior photovoltaic characteristics.

When a cross section of the photovoltaic element of Example 10 was observed with an electron microscope, it was confirmed for the i0 layer that uniform microcrystal grains were formed extending over the whole in the layer thickness direction in a layer thickness of 3000 Å. It was further confirmed through secondary ion mass spectroscopy that the implanted phosphorus atoms were distributed only on the substrate side, namely that a semiconductor junction was formed within a single microcrystal grain.

Further, the dark field image of a transmission electron microscope was observed and X-ray diffraction was measured. When the average crystal grain diameter in the photovoltaic element of Comparative Example 4 was calculated from the half-width of the X-ray diffraction (220) peaks, it was approximately 200 Å. When the average crystal grain diameter in the photovoltaic element of Comparative Example 4 was calculated from the dark field image of the transmission electron microscope, it was approximately 200 Å. On the other hand, when the average crystal grain diameter in the photovoltaic element of Example 10 was calculated from the half-width of the X-ray diffraction (220) peaks, it was approximately 250 Å. When the average crystal grain diameter in the photovoltaic element of Example 10 was calculated from the dark field image of the transmission electron microscope, it was approximately 750 Å. The difference in the average diameter calculated from X-ray diffraction and the average diameter calculated by transmission electron microscope shows that microcrystals with different grain diameters exist within the microcrystalline semiconductor layer of Example 10.

EXAMPLE 11

Using the deposited film forming apparatus shown in FIG. 2, a photovoltaic element was formed under the deposited film formation conditions shown in Table 26. The microcrystalline semiconductor having a semiconductor junction within the same microcrystal grain was used between the n-type and the i-type semiconductor layers n1 and i1 of the bottom photovoltaic element. After deposition of the n-type semiconductor layer n1, the n-type semiconductor layer n1 was irradiated with an excimer laser under the conditions shown in Table 16 in the loading chamber to crystallize the n-type semiconductor layer n1. Afterwards, an i-type semiconductor layer i1 was successively deposited on the n-type semiconductor layer n0 with the VHF plasma CVD method. When depositing the i-type semiconductor layer i1, the input power of VHF was changed every 3 seconds between the value shown in Table 26 and a value of 1.3 times the value of Table 18.

COMPARATIVE EXAMPLE 6

A photovoltaic element for comparison with Example 11 was produced in a similar manner to that of Example 11 with the exception that the n-type semiconductor layer was not treated with an excimer laser and that the VHF power was set at the constant value shown in Table 26.

COMPARISON of EXAMPLE 11 and COMPARATIVE EXAMPLE 6

The photovoltaic element characteristics of these photovoltaic elements were measured in a similar manner to that of Example 7 and Comparative Example 4. These results are shown in Table 27 in terms of relative values when the results of Comparative Example 6 are expressed as 1. The photovoltaic element of Example 11 showed photovoltaic characteristics superior to the element of Comparative Example 6. Also, the photovoltaic element of Example 11 had lower series resistance and larger shunt resistance in comparison with the element of Comparative Example 6.

One hundred photovoltaic elements each were then produced under the same conditions as Example 11 and Comparative Example 6. These photovoltaic elements were then left for 2000 hours in an atmosphere of 85° C. temperature and 85% humidity. Afterwards their photovoltaic characteristics were measured. The 100 photovoltaic elements of Example 11 had an extremely small variance of the characteristics as compared with the elements of Comparative Example 6. In other words, the photovoltaic elements of the present invention have extremely high resistance to environment (durability).

When a cross-section of each of these photovoltaic elements was observed with a transmission electron microscope, it was confirmed for the photovoltaic elements of Example 11 that the region thought to be the boundary between the n-type semiconductor layer and the i-type semiconductor layer was constituted of microcrystal grains 2000–5000 Å long in the film thickness direction. It was also confirmed through secondary ion mass spectroscopy that the impurities (dopant) were localized on the substrate side of these microcrystal grains.

EXAMPLE 12

A photovoltaic element was produced in a similar manner to that of Example 7 with the exception that after depositing the p-type semiconductor layer, the p-type semiconductor layer was irradiated with an excimer laser under the same conditions of laser irradiation as the crystallization of the n-type semiconductor layer, i.e., the conditions shown in Table 16. Through this irradiation a microcrystalline layer was formed having a semiconductor junction within the microcrystal grain, further between the i-type semiconductor layer and the p-type semiconductor layer.

COMPARISON of EXAMPLE 12 with EXAMPLE 7 and COMPARATIVE EXAMPLE 4

The photovoltaic element of Example 12 was evaluated in a similar manner to that of Example 7. These results are shown in Table 28 in terms of relative values when the results of Comparative Example 4 are expressed as 1. The photovoltaic element of Example 12 showed excellent characteristics in comparison with the element of Comparative Example 4 and the element of Example 7.

A transmission electron microscope and a secondary ion mass spectrometer were used to confirm whether or not a semiconductor junction was formed within the same microcrystal grain in the photovoltaic element of this example. As a result, it was confirmed that the element of this example had the n-type semiconductor layer and the i-type semiconductor layer within the same microcrystal grains and had the i-type semiconductor layer and the p-type semiconductor layer within the same microcrystal grains.

From the above, it was confirmed that the photovoltaic element having the n-type semiconductor layer and the i-type semiconductor layer within the same microcrystal grains and having the i-type semiconductor layer and the p-type semiconductor layer within the same microcrystal grains has the best characteristics.

One hundred photovoltaic elements each of Example 12 and Comparative Example 4 were then produced, and left for 3000 hours in an atmosphere of a nitrogen oxide at 85° C. temperature and 95% humidity while irradiating them with light of AM 1.5 and 100 mW/cm$^2$. Afterwards their photovoltaic characteristics were measured. The photovoltaic elements of Example 12 had less change in characteristics than the elements of Comparative Example 1.

Further, the current values when a 2V reverse bias was applied to the photovoltaic elements of Example 12 and the elements of Comparative Example 4 were compared. The results showed that the current values of the photovoltaic elements of Example 12 were approximately one order lower than those for the elements of Comparative Example 4.

As mentioned above, the defect states in the vicinity of the interfaces can be greatly reduced by forming semiconductor junctions such as p/i or n/i within the same microcrystal grains. As a result it is possible to prevent a decline in the open circuit voltage (Voc), short circuit current (Jsc), and fill factor (FF) of the photovoltaic element. Further, it is possible to prevent an increase in the series resistance and a decline in the shunt resistance of the photovoltaic element. As a result the photoelectric conversion efficiency of the photovoltaic device is improved.

The heat resistant properties of the semiconductor element also improves due to the formation of a semiconductor junction within the microcrystal grains.

In addition, it is possible to prevent degradation in characteristics caused by air or an encapsulant by forming a semiconductor junction within the microcrystal grains.

Further, a depletion layer of a semiconductor junction spreads further than in semiconductor elements having conventional semiconductor junctions, by forming a semiconductor junction within microcrystal grains. As a result the rectifying characteristics are better than in conventional semiconductor junctions and the dark current is kept lower when a reverse bias is applied.

Further, the presence of microcrystal grains with different grain diameters makes it is possible to make the distortion smaller than when filling three dimensional spaces (the semiconductor layer) with microcrystal grains with a uniform grain diameter. As a result, the transportability (mobility) of the photo-excited free carriers within the microcrystalline semiconductor layer increases and the lifetime of the carriers is extended.

TABLE 1

| | | SiH$_4$ | H$_2$ | PH$_3$ (2%/H$_2$) | BF$_3$ (2%/H$_2$) | Power Density (W/cm$^3$) RF | Power Density (W/cm$^3$) VHF | Vacuum Degree (mTorr) | Deposition Rate (Å/s) | Substrate Temperature (° C.) | Layer Thickness (Å) |
|---|---|---|---|---|---|---|---|---|---|---|---|
| Bottom | n1 | 2 | 48 | 0.5 | | 0.0382 | | 1300 | 1 | 225 | 200 |
| | i1 | 25 | 750 | | | | 0.12 | 300 | 1 | 250 | 15000 |
| | p1 | 0.025 | 35 | | 1 | 1.15 | | 2000 | 1 | 165 | 50 |
| Top | n2 | 2 | 48 | 0.5 | | 0.0382 | | 1300 | 1 | 225 | 100 |
| | i2 | 2 | 48 | | | 0.0382 | | 1150 | 1 | 200 | 3000 |
| | p2 | 0.025 | 35 | | 1 | 1.15 | | 2000 | 1 | 165 | 50 |

TABLE 2

| Excimer Laser | Wave Length nm | Output mJ/cm$^2$ | Vacuum Degree Torr |
|---|---|---|---|
| XeCl | 308 | 500 | 1E−05 |

TABLE 3

| | Open Circuit Voltage | Short Circuit Current | Fill Factor | Conversion Efficiency |
|---|---|---|---|---|
| Comparative Example 1 | 1 | 1 | 1 | 1 |
| Example 1 | 1.02 | 1 | 1.03 | 1.05 |

TABLE 4

| | | SiH$_4$ | SiF$_4$ | H$_2$ | PH$_3$ (2%/H$_2$) | BF$_3$ (2%/H$_2$) | Power Density (W/cm$^3$) RF | Power Density (W/cm$^3$) VHF | Power Density (W/cm$^3$) MW | Vacuum Degree (mTorr) | Deposition Rate (Å/s) | Substrate Temperature (° C.) | Layer Thickness (Å) |
|---|---|---|---|---|---|---|---|---|---|---|---|---|---|
| Bottom | n1 | 2 | | 48 | 0.5 | | 0.0382 | | | 1300 | 1 | 225 | 200 |
| | i1 | | 100 | 300 | | | | | 0.6 | 250 | 20 | 250 | 20000 |
| | p1 | 0.025 | | 35 | | 1 | 1.15 | | | 2000 | 1 | 165 | 50 |
| Top | n2 | 2 | | 48 | 0.5 | | 0.0382 | | | 1300 | 1 | 225 | 100 |
| | i2 | 2 | | 48 | | | 0.0382 | | | 1150 | 1 | 200 | 3500 |
| | p2 | 0.025 | | 35 | | 1 | 1.15 | | | 2000 | 1 | 165 | 50 |

TABLE 5

| Excimer Laser | Wave Length nm | Output mJ/cm$^2$ | Vacuum Degree Torr |
|---|---|---|---|
| XeCl | 308 | 600 | 1E−05 |

TABLE 6

| | Open Circuit Voltage | Short Circuit Current | Fill Factor | Conversion Efficiency |
|---|---|---|---|---|
| Comparative Example 2 | 1 | 1 | 1 | 1 |
| Example 2 | 1.02 | 1 | 1.02 | 1.04 |

TABLE 7

| Hydrogen Flow Rate (sccm) | Current Density (W/cm$^3$) | Vacuum Degree (Torr) | Substrate Temperature (° C.) |
|---|---|---|---|
| 100 | 0.1 | 0.5 | 300 |

TABLE 8

| | Open Circuit Voltage | Short Circuit Current | Fill Factor | Conversion Efficiency |
|---|---|---|---|---|
| Comparative Example 1 | 1 | 1 | 1 | 1 |
| Example 3 | 1.02 | 1.01 | 1.02 | 1.05 |

TABLE 9

| | | | | | PH$_3$ | BF$_3$ | Power Density (W/cm$^3$) | | Vacuum Degree | Deposition Rate | Substrate Temperature | Layer Thickness |
|---|---|---|---|---|---|---|---|---|---|---|---|---|
| | | SiH$_4$ | H$_2$ | | (2%/H$_2$) | (2%/H$_2$) | RF | VHF | (mTorr) | (Å/s) | (° C.) | (Å) |
| Bottom | i0 | 25 | 750 | | | | | 0.12 | 300 | 1 | 250 | 3000 |
| | i1 | 25 | 750 | | | | | 0.12 | 300 | 1 | 250 | 14000 |
| | p1 | 0.025 | 35 | | | 1 | 1.15 | | 2000 | 1 | 165 | 50 |
| Top | n2 | 2 | 48 | | 0.5 | | 0.0382 | | 1300 | 1 | 225 | 100 |
| | i2 | 2 | 48 | | | | 0.0382 | | 1150 | 1 | 200 | 3000 |
| | p2 | 0.025 | 35 | | | 1 | 1.15 | | 2000 | 1 | 165 | 50 |

TABLE 10

| Addition Amount (1/cm$^3$) | Vacuum Degree (Torr) | Substrate Temperature (° C.) | Annealing Temperature (° C.) |
|---|---|---|---|
| 1E+20 | 1E−07 | 300 | 600 |

TABLE 11

| | Open Circuit Voltage | Short Circuit Current | Fill Factor | Conversion Efficiency |
|---|---|---|---|---|
| Comparative Example 1 | 1 | 1 | 1 | 1 |
| Example 3 | 1.02 | 1.01 | 1.03 | 1.06 |

TABLE 12

| | | | | | | PH$_3$ | BF$_3$ | Power Density (W/cm$^3$) | | Vacuum Degree | Deposition Rate | Substrate Temperature | Layer Thickness |
|---|---|---|---|---|---|---|---|---|---|---|---|---|---|
| | | SiH$_4$ | GeH$_4$ | H$_2$ | | (2%/H$_2$) | (2%/H$_2$) | RF | VHF | (mTorr) | (Å/s) | (° C.) | (Å) |
| Bottom | n1 | 1 | 1 | 48 | 0.5 | | | 0.0382 | | 1300 | 1 | 225 | 200 |
| | i1 | 12 | 12 | 750 | | | | | 0.12 | 300 | 1 | 250 | 10000 |
| | p1 | 0.025 | | 35 | | | 1 | 1.15 | | 2000 | 1 | 165 | 50 |
| Top | n2 | 2 | | 48 | 0.5 | | | 0.0382 | | 1300 | 1 | 225 | 100 |
| | i2 | 2 | | 48 | | | | 0.0382 | | 1150 | 1 | 200 | 3500 |
| | p2 | 0.025 | | 35 | | | 1 | 1.15 | | 2000 | 1 | 165 | 50 |

TABLE 13

| | Open Circuit Voltage | Short Circuit Current | Fill Factor | Conversion Efficiency |
|---|---|---|---|---|
| Comparative Example 3 | 1 | 1 | 1 | 1 |
| Example 5 | 1.01 | 1.01 | 1.01 | 1.03 |

TABLE 14

| | Open Circuit Voltage | Short Circuit Current | Fill Factor | Conversion Efficiency |
|---|---|---|---|---|
| Comparative Example 1 | 1 | 1 | 1 | 1 |
| Example 1 | 1.02 | 1 | 1.03 | 1.05 |
| Example 6 | 1.03 | 1.01 | 1.04 | 1.08 |

TABLE 15

| | | SiH₄ | H₂ | Gas PH₃ (2%/H₂) | BF₃ (2%/H₂) | Power Density (W/cm³) RF | VHF | Vacuum Degree (mTorr) | Deposition Rate (Å/s) | Substrate Temperature (° C.) | Layer Thickness (Å) |
|---|---|---|---|---|---|---|---|---|---|---|---|
| Bottom | n1 | 2 | 48 | 0.5 | | 0.0382 | | 1300 | 1 | 225 | 200 |
| | i1 | 25 | 750 | | | | 0.15 | 300 | 1 | 300 | 15500 |
| | p1 | 0.025 | 35 | | 1 | 1.15 | | 2000 | 1 | 165 | 50 |
| Top | n2 | 2 | 48 | 0.5 | | 0.0382 | | 1300 | 1 | 225 | 100 |
| | i2 | 2 | 48 | | | 0.0382 | | 1150 | 1 | 200 | 3000 |
| | p2 | 0.025 | 35 | | 1 | 1.15 | | 2000 | 1 | 165 | 50 |

TABLE 16

| Excimer Laser | Wave Length nm | Output mJ/cm² | Vacuum Degree Torr |
|---|---|---|---|
| XeCl | 308 | 500 | 1E-05 |

TABLE 17

| | Open Circuit Voltage | Short Circuit Current | Fill Factor | Conversion Efficiency |
|---|---|---|---|---|
| Comparative Example 4 | 1 | 1 | 1 | 1 |
| Example 7 | 1.021 | 1.001 | 1.032 | 1.055 |

TABLE 18

| | | SiH₄ | SiF₄ | H₂ | Gas PH₃ (2%/H₂) | BF₃ (2%/H₂) | Power Density (W/cm³) RF | MW | Vacuum Degree (mTorr) | Deposition Rate (Å/s) | Substrate Temperature (° C.) | Layer Thickness (Å) |
|---|---|---|---|---|---|---|---|---|---|---|---|---|
| Bottom | n1 | 2 | | 48 | 0.5 | | 0.0382 | | 1300 | 1 | 225 | 200 |
| | i1 | | 100 | 350 | | | | 0.62 | 250 | 20 | 250 | 20000 |
| | p1 | 0.025 | | 35 | | 1 | 1.15 | | 2000 | 1 | 165 | 50 |
| Top | n2 | 2 | | 48 | 0.5 | | 0.0382 | | 1300 | 1 | 225 | 100 |
| | i2 | 2 | | 48 | | | 0.0382 | | 1150 | 1 | 200 | 3500 |
| | p2 | 0.025 | | 35 | | 1 | 1.15 | | 2000 | 1 | 165 | 50 |

TABLE 19

| Excimer Laser | Wave Length nm | Output mJ/cm² | Vacuum Degree Torr |
|---|---|---|---|
| XeCl | 308 | 600 | 1E-05 |

TABLE 20

| | Open Circuit Voltage | Short Circuit Current | Fill Factor | Conversion Efficiency |
|---|---|---|---|---|
| Comparative Example 5 | 1 | 1 | 1 | 1 |
| Example 8 | 1.032 | 1.01 | 1.022 | 1.065 |

TABLE 21

| Hydrogen Flow Rate (sccm) | Current Density (W/cm³) | Vacuum Degree (Torr) | Substrate Temperature (° C.) |
|---|---|---|---|
| 100 | 0.1 | 0.5 | 300 |

TABLE 22

| | Open Circuit Voltage | Short Circuit Current | Fill Factor | Conversion Efficiency |
|---|---|---|---|---|
| Comparative Example 4 | 1 | 1 | 1 | 1 |
| Example 9 | 1.03 | 1.02 | 1.02 | 1.07 |

TABLE 23

| | | SiH$_4$ | H$_2$ | Gas PH$_3$ (2%/H$_2$) | BF$_3$ (2%/H$_2$) | Power Density (W/cm$^3$) RF | VHF | Vacuum Degree (mTorr) | Deposition Rate (Å/s) | Substrate Temperature (° C.) | Layer Thickness (Å) |
|---|---|---|---|---|---|---|---|---|---|---|---|
| Bottom | i0 | 25 | 750 | | | | 0.12 | 300 | 1 | 250 | 3000 |
| | i1 | 25 | 750 | | | | 0.12 | 300 | 1 | 350 | 16000 |
| | p1 | 0.025 | 35 | | 1 | 1.15 | | 2000 | 1 | 165 | 50 |
| Top | n2 | 2 | 48 | 0.5 | | 0.0382 | | 1300 | 1 | 225 | 100 |
| | i2 | 2 | 48 | | | 0.0382 | | 1150 | 1 | 200 | 3000 |
| | p2 | 0.025 | 35 | | 1 | 1.15 | | 2000 | 1 | 165 | 50 |

TABLE 24

| Addition Amount (l/cm$^3$) | Vacuum Degree (Torr) | Substrate Temperature (° C.) | Annealing Temperature (° C.) |
|---|---|---|---|
| 1E+20 | 1E−07 | 300 | 600 |

TABLE 25

| | Open Circuit Voltage | Short Circuit Current | Fill Factor | Conversion Efficiency |
|---|---|---|---|---|
| Comparative Example 4 | 1 | 1 | 1 | 1 |
| Example 10 | 1.03 | 1.01 | 1.03 | 1.07 |

TABLE 26

| | | SiH$_4$ | GeH$_4$ | H$_2$ | Gas PH$_3$ (2%/H$_2$) | BF$_3$ (2%/H$_2$) | Power Density (W/cm$^3$) RF | VHF | Vacuum Degree (mTorr) | Deposition Rate (Å/s) | Substrate Temperature (° C.) | Layer Thickness (Å) |
|---|---|---|---|---|---|---|---|---|---|---|---|---|
| Bottom | n1 | 1 | 1 | 48 | 0.5 | | 0.0382 | | 1300 | 1 | 225 | 200 |
| | i1 | 12 | 12 | 800 | | | | 0.17 | 200 | 1 | 300 | 10000 |
| | p1 | 0.025 | | 35 | | 1 | 1.15 | | 2000 | 1 | 165 | 50 |
| Top | n2 | 2 | | 48 | 0.5 | | 0.0382 | | 1300 | 1 | 225 | 100 |
| | i2 | 2 | | 48 | | | 0.0382 | | 1150 | 1 | 200 | 3000 |
| | p2 | 0.025 | | 35 | | 1 | 1.15 | | 2000 | 1 | 165 | 50 |

TABLE 27

| | Open Circuit Voltage | Short Circuit Current | Fill Factor | Conversion Efficiency |
|---|---|---|---|---|
| Comparative Example 6 | 1 | 1 | 1 | 1 |
| Example 11 | 1.012 | 1.03 | 1.03 | 1.074 |

TABLE 28

| | Open Circuit Voltage | Short Circuit Current | Fill Factor | Conversion Efficiency |
|---|---|---|---|---|
| Comparative Example 4 | 1 | 1 | 1 | 1 |
| Example 4 | 1.021 | 1.001 | 1.032 | 1.055 |
| Example 12 | 1.032 | 1.02 | 1.04 | 1.095 |

What is claimed is:

1. A method of manufacturing a semiconductor element, comprising the steps of:
   forming a semiconductor layer having first electric characteristics on a substrate;
   crystallizing the semiconductor layer having the first electric characteristics; and
   growing a crystalline semiconductor layer having second electric characteristics on the crystallized semiconductor layer having the first electric characteristics, thereby growing a microcrystal grain so as to extend over the semiconductor layer having the first electric characteristics and the semiconductor layer having the second electric characteristics.

2. A method of manufacturing a semiconductor element, comprising the steps of:
   forming a crystalline semiconductor layer having first electric characteristics on a substrate; and
   growing a crystalline semiconductor layer having second electric characteristics on the semiconductor layer having the first electric characteristics, thereby growing a microcrystal grain so as to extend over the semiconductor layer having the first electric characteristics and the semiconductor layer having the second electric characteristics.

3. A method of manufacturing a semiconductor element, comprising the steps of:
   forming a semiconductor layer having first electric characteristics on a substrate;
   growing a semiconductor layer having second electric characteristics on the semiconductor layer having the first electric characteristics; and
   effecting annealing to form a microcrystal grain so as to extend over the semiconductor layer having the first electric characteristics and the semiconductor layer having the second electric characteristics.

4. A method of manufacturing a semiconductor element, comprising the step of generating a plasma in a gas phase to decompose a source gas thus forming a semiconductor layer comprising microcrystals on a substrate, wherein an electric power to be applied to the plasma is periodically changed to form a semiconductor layer comprising microcrystal grains of different sizes as a mixture.

5. A method of manufacturing a semiconductor element, comprising the step of generating a plasma in a gas phase to decompose a source gas thus forming a semiconductor layer comprising microcrystals on a substrate, wherein a halogen-containing gas is added at regular intervals into the source gas to form a semiconductor layer comprising microcrystal grains of different sizes as a mixture.

* * * * *